(12) United States Patent
Kim

(10) Patent No.: US 12,526,935 B2
(45) Date of Patent: Jan. 13, 2026

(54) DISPLAY DEVICE INCLUDING GUIDE MEMBERS WITH A GROOVE AND A PROTRUSION

(71) Applicant: LG Display Co., Ltd., Seoul (KR)

(72) Inventor: Juhan Kim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 172 days.

(21) Appl. No.: 18/435,711

(22) Filed: Feb. 7, 2024

(65) Prior Publication Data
US 2024/0284613 A1    Aug. 22, 2024

(30) Foreign Application Priority Data
Feb. 20, 2023    (KR) .................. 10-2023-0022206

(51) Int. Cl.
| | | |
|---|---|---|
| H05K 5/02 | (2006.01) | |
| B60K 35/22 | (2024.01) | |
| B60K 35/60 | (2024.01) | |
| H10K 59/90 | (2023.01) | |
| H10K 102/00 | (2023.01) | |

(52) U.S. Cl.
CPC .......... *H05K 5/0217* (2013.01); *B60K 35/223* (2024.01); *B60K 35/60* (2024.01); *B60K 2360/771* (2024.01); *H10K 59/90* (2023.02); *H10K 2102/311* (2023.02)

(58) Field of Classification Search
CPC .... G09F 1/1652; G09F 1/1624; G09F 1/1656; G09F 1/1681; G09F 1/1601; G09F 1/1616; G09F 1/1675; G09F 1/1677; G09F 9/301; G09F 9/30; H05K 5/0217; H05K 5/0018; H05K 5/0086; H05K 5/03; H05K 5/06
See application file for complete search history.

(56) References Cited

U.S. PATENT DOCUMENTS

| | | | |
|---|---|---|---|
| 11,468,801 B2 | 10/2022 | Oh | |
| 12,253,886 B2* | 3/2025 | Zhao | .................. G09F 9/30 |
| 2021/0142698 A1* | 5/2021 | Oh | .................. H10K 59/871 |
| 2022/0130288 A1* | 4/2022 | Park | .................. G06F 1/1681 |
| 2022/0130289 A1* | 4/2022 | Kang | .................. G09F 9/301 |
| 2023/0036277 A1* | 2/2023 | Lee | .................. F16M 13/005 |
| 2023/0217800 A1* | 7/2023 | Lee | .................. G06F 1/1601 |
| | | | 257/40 |

FOREIGN PATENT DOCUMENTS

| | | |
|---|---|---|
| KR | 20210056580 A | 5/2021 |
| KR | 20220061789 A | 5/2022 |

* cited by examiner

*Primary Examiner* — Abhishek M Rathod
(74) *Attorney, Agent, or Firm* — Seed Intellectual Property Law Group LLP

(57) ABSTRACT

A display apparatus includes a display unit having at least a portion being deformable, a display panel included in the display unit, a first guide member disposed on a rear surface of the display unit, the first guide member having at least a portion being deformable, a printed circuit board electrically connected to the display panel, and a second guide member configured so that at least a portion of each of the display unit and the first guide member is wound around the second guide member. One of the first guide member and the second guide member has at least one groove defined therein, while the other of the first guide member and the second guide member has at least one protrusion.

26 Claims, 16 Drawing Sheets

DISPLAY DEVICE INCLUDING GUIDE MEMBERS WITH A GROOVE AND A PROTRUSION

CROSS-REFERENCE TO RELATED APPLICATION

This application claims priority to Korean Patent Application No. 10-2023-0022206 filed on Feb. 20, 2023, the entire contents of which are hereby expressly incorporated by reference herein for all purposes.

BACKGROUND

Technical Field

The present disclosure relates to a display apparatus, and more particularly, for example, without limitation, to a rollable display apparatus.

Description of the Related Art

Contents described in this Background section simply provide background information about the present disclosure and do not constitute the prior art because it is mentioned in or associated with the description of the related art section. The description of the related art section may include information that describes one or more aspects of the subject technology, and the description in this section does not limit the disclosure.

As we enter a full-fledged information era, a display device that visually displays an electrical information signal has developed rapidly. In response thereto, various display devices having excellent performance, thinness, light weight, and low power consumption have been developed. The display devices include a liquid crystal display device (LCD), a quantum dot display device (QD), an organic light-emitting display device (OLED), a plasma display device, and an inorganic light-emitting display device (Micro-LED), etc. Existing display device technology has a number of drawbacks and deficiencies when such technology is applied to flexible or rollable display devices, including with respect to reliability and durability, as well as winding or unwinding the display device.

BRIEF SUMMARY

The inventors have recognized beneficial developments and improvements for high performance of display apparatuses. For user convenience and other advantages, development of a rollable display apparatus is active. In a rollable display apparatus, a display module included therein may be provided with a display unit that rolls up and has a flexible structure which is able to be bent.

As the user uses the display apparatus, a spacing between and movement of parts of the display apparatus may occur, thereby causing damage to the display unit of the display apparatus. Therefore, malfunction or breakdown of the display unit may occur. A solution to these and other problems would be beneficial.

In one or more embodiments, a display apparatus is provided in which vibration of parts of the display apparatus is suppressed to improve the reliability of the display apparatus.

A display apparatus according to an embodiment of the present disclosure includes a display unit having at least a portion being deformable; a display panel included in the display unit; a first guide member disposed on a rear surface of the display unit, and having at least a portion being deformable; a printed circuit board electrically connected to the display panel; and a second guide member configured so that at least a portion of each of the display unit and the first guide member is wound around the second guide member, wherein one of the first guide member and the second guide member has at least one groove defined therein, while the other of the first guide member and the second guide member has at least one protrusion.

A display apparatus according to an embodiment of the present disclosure includes a display panel having at least a portion being deformable, a cover member disposed on the display panel, a support member disposed on a rear surface of the display panel, a first guide member disposed on the rear surface of the display panel and having at least a portion being deformable, a printed circuit board electrically connected to the display panel, and a second guide member configured so that at least a portion of each of the display panel and the first guide member is wound around the second guide member, wherein the first guide member may include a plurality of first members, and a space area may be defined between adjacent ones of the plurality of first members.

According to an embodiment of the present disclosure, the first guide member applied to the display apparatus has a structure that supports the rear surface of the display unit, so that the display unit operates normally without shaking when the display apparatus is bent or returned to a flat state.

According to an embodiment of the present disclosure, one of the first guide member and the second guide member applied to the display apparatus has the groove and the other thereof has the protrusion to prevent vibration of the display unit of the display apparatus, thereby providing a display apparatus with improved reliability.

According to an embodiment of the present disclosure, even when the display apparatus is repeatedly bent, the display unit does not receive additional stress during the bending or unfolding operation because the first guide member supports the display unit. Thus, a long-life, low-power display apparatus with improved durability may be realized.

Embodiments and advantages of the present disclosure are not limited to the above-mentioned embodiments and advantages. Other embodiments and advantages of the present disclosure that are not mentioned may be understood based on following descriptions, and may be more clearly understood based on the described and shown embodiments of the present disclosure. Further, it will be easily understood that the embodiments and advantages of the present disclosure may be realized using concepts in the claims and combinations thereof.

Specific details of the above and embodiments are included in the following detailed description and enclosed drawings.

Benefits and advantages of the present disclosure are not limited to the benefits and advantages mentioned above, and other benefits and advantages not mentioned will be clearly understood by those skilled in the art from the descriptions below. The scope of claims is not limited by anything in the Summary or Background sections.

BRIEF DESCRIPTION OF THE SEVERAL VIEWS OF THE DRAWINGS

The above and other aspects, features, and advantages of the present disclosure will be more clearly understood from the following detailed description taken in conjunction with the accompanying drawings, in which.

Figure 1:
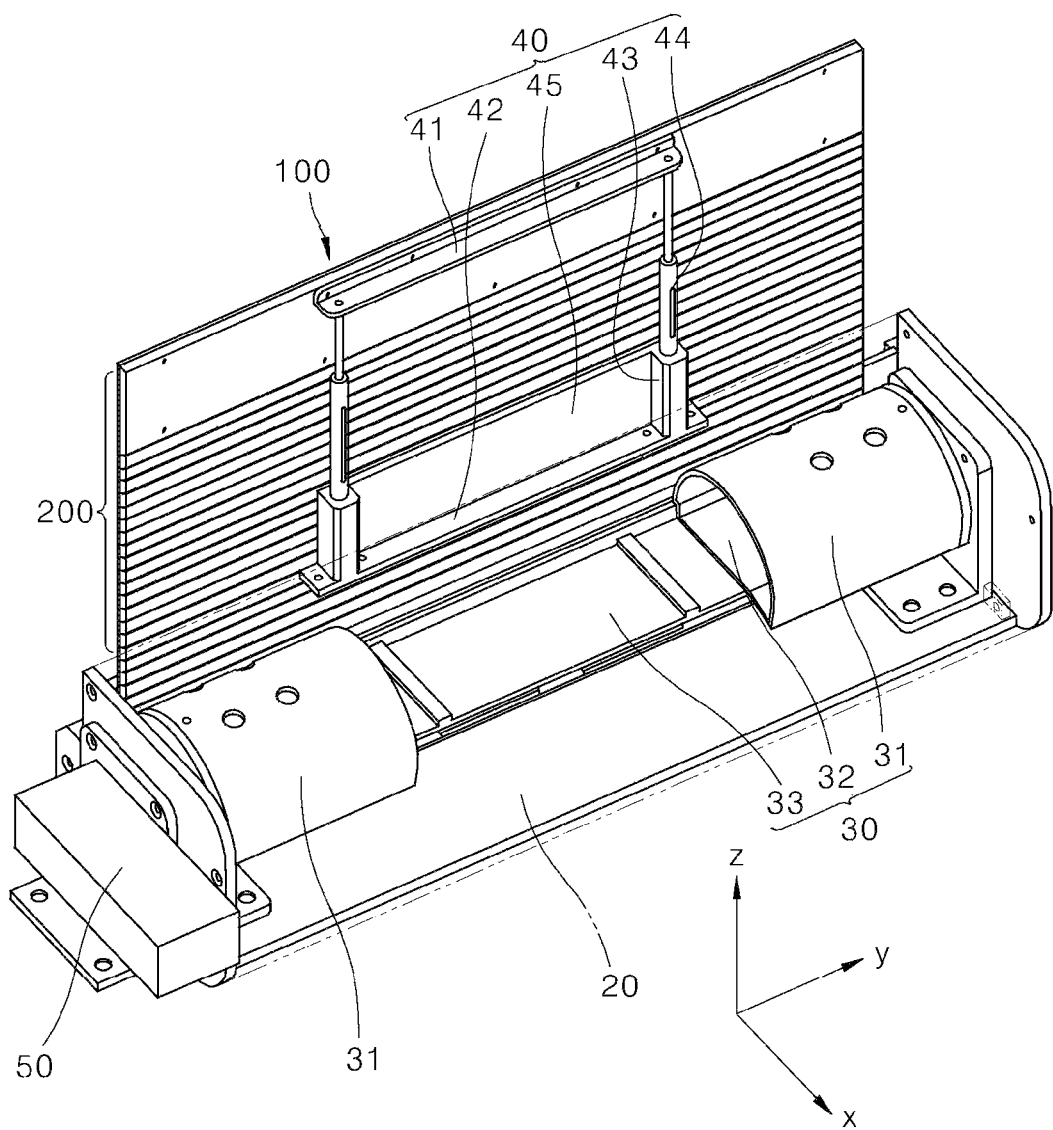
FIG. 1 is a perspective view showing a display apparatus according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Advantages and features of the present disclosure, and a method of achieving the advantages and features will become apparent with reference to embodiments described later in detail together with the accompanying drawings. However, the present disclosure is not limited to the embodiments as disclosed under, but may be implemented in various different forms. Thus, these embodiments are set forth only to make the present disclosure complete, and to completely inform the scope of the present disclosure to those of ordinary skill in the technical field to which the present disclosure belongs, and does not limit the scope of the claims.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure. The claims are not limited by the disclosure.

A shape, a size, an area, a ratio, an angle, a number, etc., disclosed in the drawings for illustrating embodiments of the present disclosure are illustrative, and the present disclosure is not limited thereto. Further, in the following description of the present disclosure, a detailed explanation of known related technologies may be omitted to avoid unnecessarily obscuring the subject matter of the present disclosure. The terms such as "include," "have," "comprise," "contain," "constitute," "make up of," "formed of," and "consist of" used herein are generally intended to allow other components to be added unless the terms are used with the term such as "only". Any references to singular may include plural unless expressly stated otherwise.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element or layer may be disposed directly on the second element or layer or may be disposed indirectly on the second element or layer with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

When a certain embodiment may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, terms, such as first, second, A, B, (a), (b), or the like may be used herein when describing components of the present disclosure. Each of these terminologies is not used to define an essence, order, or sequence of a corresponding component but used merely to distinguish the corresponding component from other components. In the case that it is described that a certain structural element or layer is "connected", "coupled", "adhered" or "joined" to another structural element or layer, it is typically interpreted that another structural element or layer may be "connected", "coupled", "adhered" or "joined" to the structural element or layer directly or indirectly.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly.

As used herein, "embodiments," "examples," "aspects," and the like should not be construed such that any aspect or design as described is superior to or advantageous over other aspects or designs.

Further, the term 'or' means 'inclusive or' rather than 'exclusive or'. That is, unless otherwise stated or clear from the context, the expression that 'x uses a or b' means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for illustrating embodiments.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

As used herein, the term "display apparatus" may include, in a narrow sense, a display apparatus including a liquid crystal module (LCM), an organic light-emitting diode (OLED) module, or a quantum dot (QD) module including a display panel and a driver for driving the display panel. Moreover, the display apparatus may include, in a broad sense, a laptop computer, a television, a computer monitor, an automotive device or an equipment display for a vehicle, a set electronic device, a set device or a set apparatus including a complete product or a final product including the LCM, the OLED module, or the QD module.

Therefore, the display apparatus in accordance with the present disclosure may include, in the narrow sense, a display apparatus itself including, for example, the LCM, the OLED module, QD module, etc., and may include, in a broad sense, the set device as an application product or an end-user device including a complete product or a final product including the LCM, the OLED module, or the QD module.

Moreover, in some cases, the LCM, OLED module, or QD module composed of the display panel and the driver may be expressed as "display apparatus" in a narrow sense. The electronic device as a complete product including the LCM, OLED module or QD module may be expressed as "set" device" in a broad sense. For example, the display apparatus in the narrow sense may include a display panel such as a liquid crystal panel, an organic light-emitting display panel, or a quantum dot display panel, and a source PCB as a controller for driving the display panel. The set device in the broad sense may include a display panel such as a liquid crystal panel, an organic light-emitting display panel, or a quantum dot display panel, a source PCB as a controller for driving the display panel, and a set PCB as a set controller that is electrically connected to the source PCB and controls the set device.

As used herein, the display panel may be of any type of the display panels such as a liquid crystal display panel, an organic light emitting diode (OLED) display panel, a quantum dot (QD) display panel, plasma display panel, and an electroluminescent display panel, etc. The display panel used in the disclosure may be not limited to a specific display panel including a flexible substrate for the OLED display panel and an underlying back plate support structure and having a bendable bezel. Moreover, the display panel used in the display apparatus according to an embodiment of the present disclosure is not limited to a shape or a size of the display panel.

More specifically, when the display panel is embodied as the organic light emitting diode (OLED) display panel, the display panel may include a plurality of gate lines and data lines, and pixels respectively formed in areas where the gate lines and the data lines intersect with each other. Moreover, the display panel may be configured to include an array including a thin-film transistor as an element for selectively applying a voltage to each pixel, an organic light-emitting element layer on the array, and an encapsulation substrate or an encapsulation layer disposed on the array to cover the organic light-emitting element layer. The encapsulation layer protects the thin-film transistor and the organic light-emitting element layer from external impact, and may prevent moisture or oxygen from penetrating into the organic light-emitting element layer. Moreover, the light emitting layer formed on the array may include an inorganic light emitting layer, for example, a nano-sized material layer, or a quantum dot.

In the aspects of the present disclosure, a source electrode and a drain electrode are distinguished from each other, for convenience of description. However, the source electrode and the drain electrode are used interchangeably. The source electrode may be the drain electrode, and the drain electrode may be the source electrode. Also, the source electrode in any one aspect of the present disclosure may be the drain electrode in another aspect of the present disclosure, and the drain electrode in any one aspect of the present disclosure may be the source electrode in another aspect of the present disclosure.

A display apparatus including a display module according to an embodiment of the present disclosure may be mounted on a mobile apparatus such as a vehicle or any other transportation device, including without limitation, trains, buses, cars, trucks (whether passenger or commercial), automobiles, and the like to provide convenience to users. Hereinafter, the display apparatus mounted on the vehicle's dashboard is described by way of example. Embodiments of the present disclosure are not limited thereto. FIG. 1 is a perspective view showing a display apparatus 1000 according to an embodiment of the present disclosure.

Figure 2:
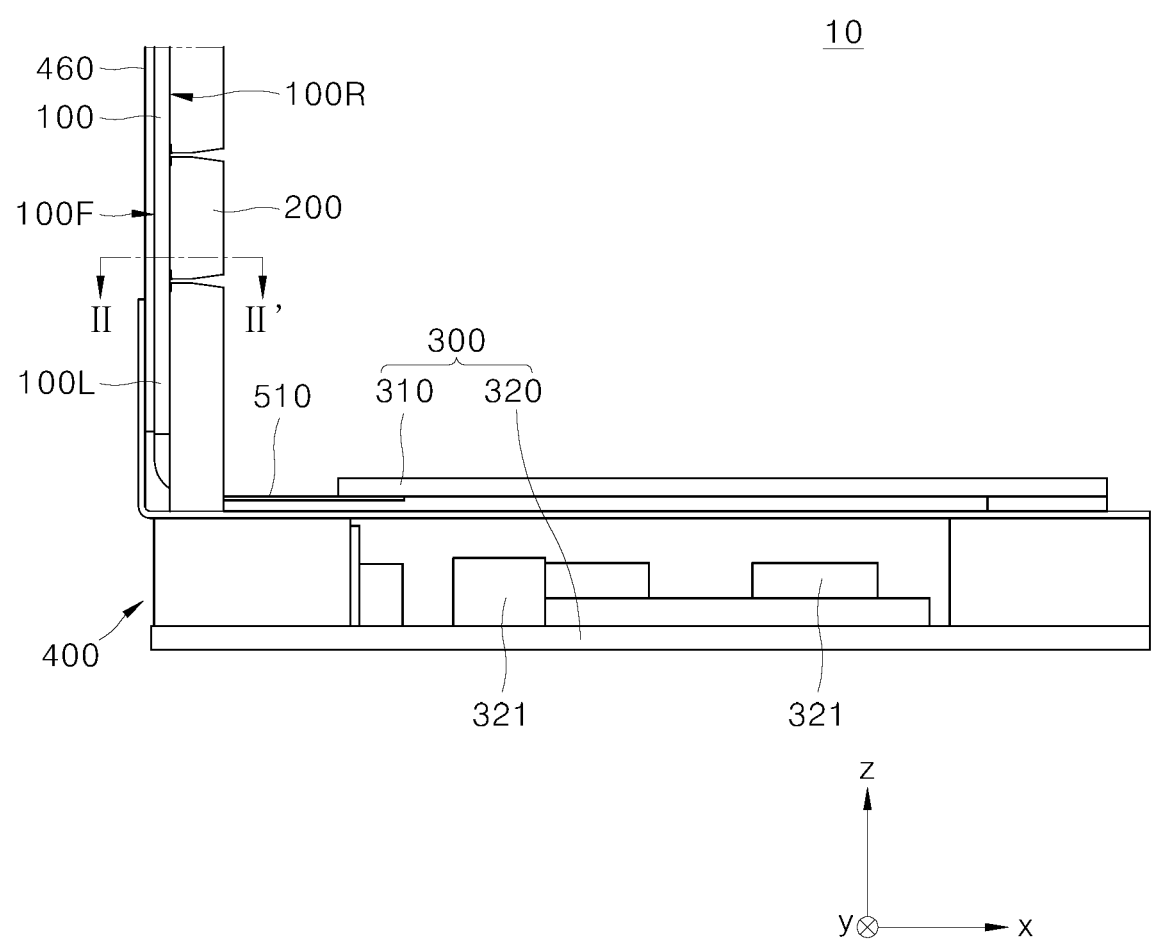
FIG. 2 is a diagram showing a lower end of a side of a portion of a display apparatus according to an embodiment of the present disclosure.

FIG. 2 is a diagram showing a lower end of a side of a portion of the display apparatus 1000 according to an embodiment of the present disclosure. All the components of each display apparatus according to all embodiments of the present disclosure are operatively coupled and configured.

With reference to FIG. 1 and FIG. 2, the display apparatus 1000 according to one or more embodiments may include a display unit 100 (which may also be referred to herein as a display 100 or a display panel 100), a housing 20, a first guide member 200, a second guide member 30, a guide unit 40 (which may also be referred to herein as a guide assembly 40 or a guide frame 40), and a motor 50.

The housing 20 may accommodate therein at least a portion of the display unit 100. For example, the housing 20 may be installed so as to be embedded in a dashboard of a vehicle. Embodiments of the present disclosure are not limited thereto. For example, each of the display unit 100 and the first guide member 200 may be installed so that at least a portion thereof may not be covered with the dashboard so as to be exposed to an outside. In an embodiment, at least the display unit 100 and the first guide member 200 extend into or out of the housing 20 which is embedded or otherwise contained within or internal to the dashboard of the vehicle. A size of a portion of each of the display unit 100 and the first guide member 200 accommodated in the housing 20 may vary.

The display apparatus 1000 according to an embodiment of the present disclosure may include a display module 10.

The display module 10 may include the display unit 100, the first guide member 200, a printed circuit board 300, and a bracket 400. The first guide member 200 may be disposed in or on a surface of the display unit 100 that is opposite to a display area of the display unit 100. In an embodiment, the first guide member 200 is disposed on a rear or back surface 100R. At least a portion of the display unit 100 may be made of a flexible material that is deformable. For example, the at least a portion of the display unit 100 may be formed of a flexible polymer film. For example, the flexible polymer film may be made of any one of polyimide (PI), polyethylene terephthalate (PET), acrylonitrile-butadiene-styrene copolymer(ABS), polymethyl methacrylate (PMMA), polyethylene naphthalate (PEN), polycarbonate (PC), polyethersulfone (PES), polyarylate (PAR), polysulfone (PSF), cyclic olefin copolymer (COC), triacetylcellulose (TAC), polyvinyl alcohol (PVA), and polystyrene (PS), and the present disclosure is not limited thereto.

The first guide member 200 may guide the display unit 100 so as to be bendable or rollable, or slidable in one direction. For example, the first guide member 200 may be an apron. However, the present disclosure is not limited thereto. The first guide member 200 may reinforce the rigidity of the display unit 100 to prevent the display unit 100 from being bent in an undesirable direction. The first guide member 200 may be made of a metal material such as aluminum (Al), magnesium (Mg), or stainless steel (SUS). Embodiments of the present disclosure are not limited thereto.

The first guide member 200 may have a structure in which at least a portion thereof is deformable so that the at least a portion thereof may move integrally with the display unit 100 into and out of the housing 20. Each of the display unit 100 and the first guide member 200 may be configured so that at least a portion thereof slides in a first direction (for example, a Z direction shown in FIG. 1). For example, each of the display unit 100 and the first guide member 200 may be configured so that at least a portion thereof moves up and down with respect to the display apparatus 1000.

The display apparatus 1000 may include the housing 20 which accommodates therein at least a portion of each of the display unit 100 and the first guide member 200. When each of the display unit 100 and the first guide members 200 descends (moves down), at least a portion of each of the display unit 100 and the first guide member 200 is bent into a curved shape in a side view to be accommodated inside the housing 20.

Each of the display unit 100 and the first guide member 200 may be configured so that at least a portion thereof is wound around the second guide member 30 provided in the display apparatus 1000. Accordingly, deformation of each of the display unit 100 and the first guide member 200 may occur continuously during rolling and unrolling operations and repeatedly across operational cycles.

For example, the second guide member 30 may be a rolling guide.

For example, the second guide member 30 may be made of a metal material such as aluminum (Al), magnesium (Mg), or stainless steel (SUS). However, embodiments of the present disclosure are not limited thereto. For example, the second guide member 30 may be made of the same or different material as or from that of the first guide member 200.

A protective film 460 may be attached to a front surface 100F of the display unit 100 to protect the display unit 100. For example, for protection of the user, the protective film 460 may be embodied as an anti-shattering film that prevents damaged pieces from scattering when the display unit 100 is damaged by external impact. However, embodiments of the present disclosure are not limited thereto, and the protective film 460 may be omitted in some embodiments.

The display unit 100 may be formed in a plate form. However, embodiments of the present disclosure are not limited thereto. The display unit 100 may include a cover member and a display panel that is attached to one surface of the cover member and display a video or images.

Figure 5:
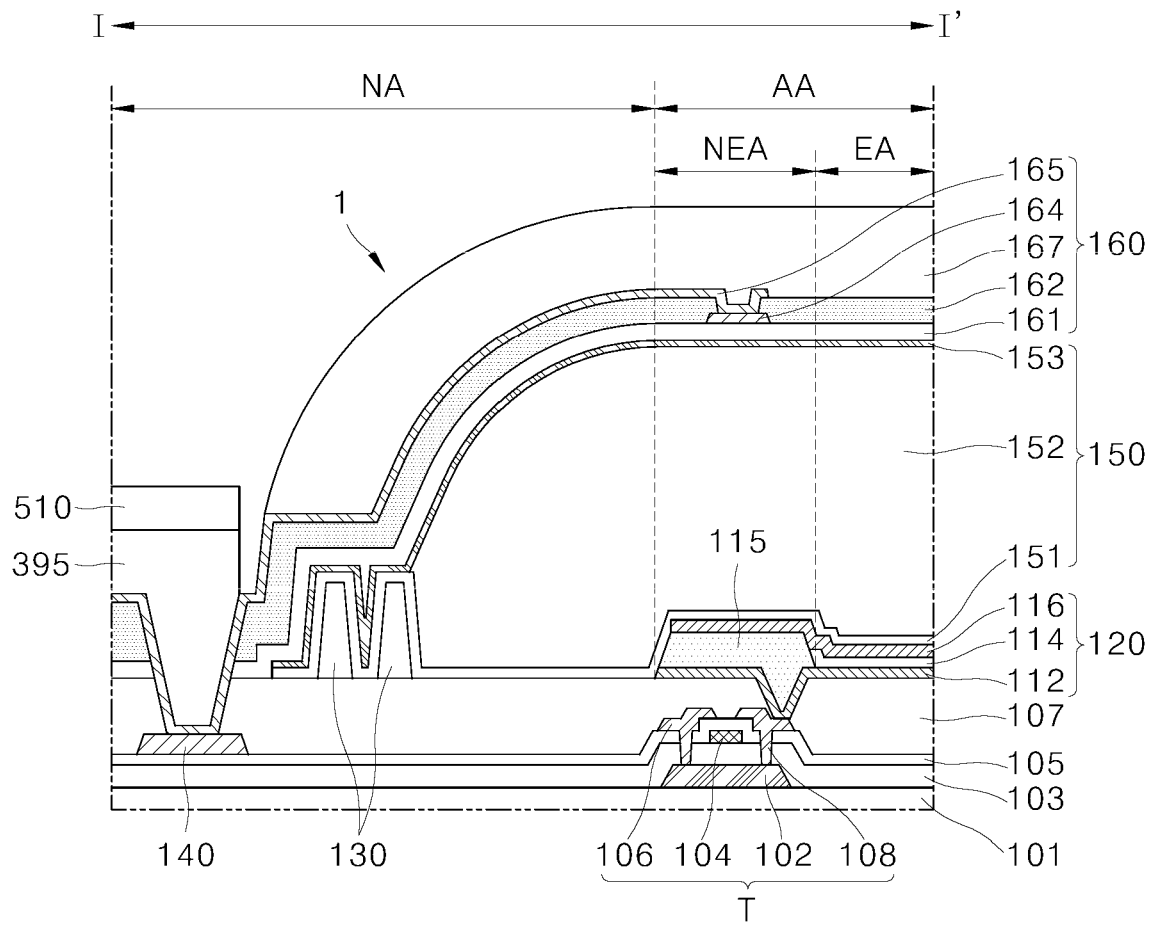
FIG. 5 is a cross-sectional view taken along line I-I' in FIG. 3 according to an embodiment of the present disclosure.

In the display panel, an active area AA and the non-active area NA disposed in the vicinity of the active area AA or surrounding the active area AA may be defined (FIG. 5).

The active area AA is an area in which images are displayed in the display apparatus 1000. In the active area AA, a plurality of sub pixels SP which configures a plurality of pixels PX and a circuit for driving the plurality of sub pixels SP may be disposed. The plurality of sub pixels SP is a minimum unit which configures the active area AA and n sub pixels SP may form one pixel PX, where n is a positive integer. In each of the plurality of sub pixels SP, a light emitting diode, a thin film transistor TFT for driving the light emitting diode, and the like may be disposed. The plurality of light emitting diodes may be defined in different ways depending on the type of the display panel. For example, when the display panel is an inorganic light emitting display panel, the light emitting diode may be an inorganic light emitting diode (LED) or an inorganic micro light emitting diode (LED), and when the display panel is an organic light emitting display panel, the light emitting diode may be an organic light emitting diode (OLED), but the embodiments of the present disclosure are not limited thereto.

In the active area AA, a plurality of wiring lines which transmits various signals to the plurality of sub pixels SP is disposed. For example, the plurality of wiring lines may include a plurality of data lines DL which supplies a data voltage to each of the plurality of sub pixels SP, a plurality of scan lines SL which supplies a scan signal to each of the plurality of sub pixels SP, and the like. The plurality of scan lines SL extends in one direction in the active area AA to be connected to the plurality of sub pixels SP and the plurality of data lines DL extends in a direction different from the one direction in the active area AA to be connected to the plurality of sub pixels SP. In addition, in the active area AA, a low potential power line, a high potential power line, and the like may be further disposed, but are not limited thereto.

The non-active area NA is an area where images are not displayed so that the non-active area NA may be defined as an area extending from the active area AA. In the non-active area NA, a link line which transmits a signal to the sub pixel SP of the active area AA, a pad electrode, or a driving IC, such as a gate driver IC or a data driver IC, may be disposed.

The display unit 100 may be formed in a structure in which an optical film, a support member supporting the display panel, and various adhesives that adhere them to each other are stacked with the layers described herein in direct or indirect contact with each other. The optical film may include, for example, a polarizer. However, embodiments of the present disclosure are not limited thereto. The support member may include, for example, a back plate. However, embodiments of the present disclosure are not limited thereto.

Since the display unit 100 according to an embodiment of the present disclosure is wound around the second guide member 30 that has a rollable structure, bending of the display unit 100 may occur continuously during operation and repeatedly, as noted above.

The display apparatus 1000 according to an embodiment of the present disclosure may further include a bracket 400. The bracket 400 may be attached to a lower end 100L of the display unit 100. The bracket 400 may be disposed to overlap the printed circuit board 300.

The printed circuit board 300 may be mounted on the bracket 400. The bracket 400 may be coupled to the first guide member 200 to fix the display unit 100 or couple the display unit 100 to the bracket 400 via the first guide member 200.

The bracket 400 may be coupled to the display unit 100 and may fix the display unit 100 to maintain close contact between the display unit 100 and the first guide member 200, such that a spacing between the display unit 100 and the first guide member 200 may be suppressed or reduced.

The bracket 400 may be coupled to the first guide member 200 and disposed to surround the lower end 100L of the display unit 100, so that a front surface 100F of the lower end 100L of the display unit 100 is fixed by the bracket 400 and a rear surface 100R of the lower end 100L thereof may be fixed by the first guide member 200.

The lower end 100L of the display unit 100 may be fixed by the bracket 400 and the first guide member 200, so that even when the display unit 100 is repeatedly bent, layers that constitute the display unit 100 are maintained to be in close contact with each other, and peeling-off of the layers at the lower end 100L of the display unit 100 may be prevented or reduced.

Figure 3:
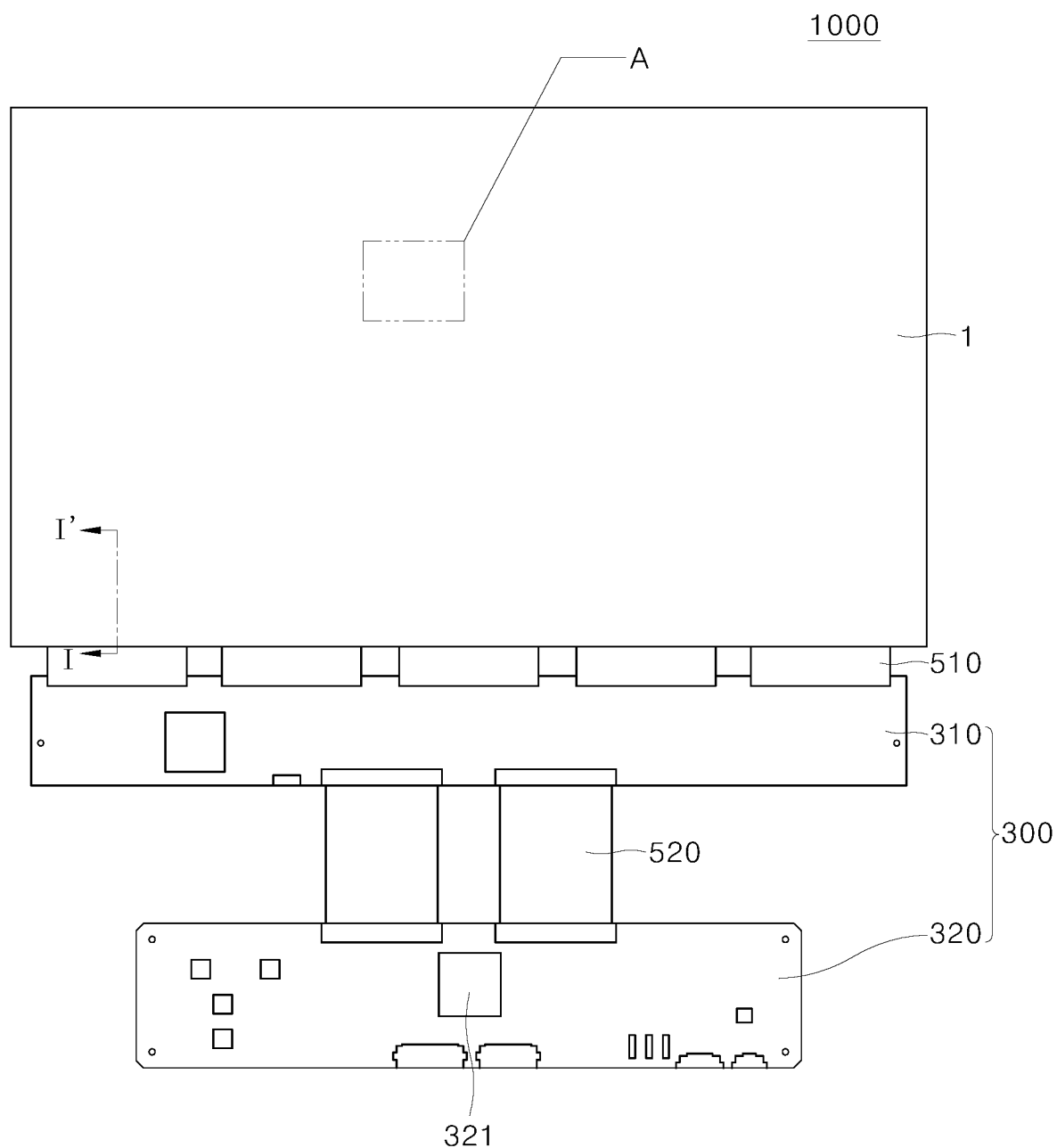
FIG. 3 is a plan view showing a display apparatus according to an embodiment of the present disclosure.

FIG. 3 is a plan view of aspects of the display apparatus 1000 according to an embodiment of the present disclosure.

FIG. 3 is a diagram showing a combined structure of a display panel 1 of the display unit 100 and the printed circuit board 300 in the display apparatus 1000 according to one or more embodiments. With continuing reference to FIG. 2, printed circuit boards 310, 320 and connectors 510, 520 connecting the printed circuit boards 310, 320 to each other may be mounted on the bracket 400 to be described later while portions thereof are bent.

The display apparatus 1000 may further include the printed circuit board 300 including a driving circuit that controls an operation of the display unit 100. The printed circuit board 300 may be electrically connected to the display unit 100 and may include a plurality of printed circuit boards 310, 320 and at least one connector 520 connecting the printed circuit boards 310, 320 to each other. The driving circuit may be disposed in a distributed manner across the printed circuit boards 310, 320 and the connectors 510 and 520. In addition, the printed circuit board 300 may be flexible printed circuit board, and/or the at least one connector may be made of flexible film. However, embodiments of the present disclosure are not limited thereto.

The printed circuit board 300 may include a first printed circuit board 310 and a second printed circuit board 320. The printed circuit board 300 may include one or more printed circuit boards. However, embodiments of the present disclosure are not limited thereto.

The first printed circuit board 310 may be electrically connected to the display unit 100. The first printed circuit board 310 may be disposed to be spaced apart from the display unit 100. The first printed circuit board 310 may be equipped with various active elements, passive elements, and printed circuits that constitute the driving circuit. The first printed circuit board 310 may include a source printed circuit board. However, embodiments of the present disclosure are not limited thereto.

For example, the first printed circuit board 310 may be equipped with elements that transmit and receive signals related to video or images played on the display unit 100. For example, the elements may have small sizes. However, embodiments of the present disclosure are not limited thereto. The first printed circuit board 310 may be provided with the element having a relatively smaller volume compared to a volume of an element of the second printed circuit board 320. However, embodiments of the present disclosure are not limited thereto.

The second printed circuit board 320 may be electrically connected to the first printed circuit board 310 and may be disposed so as to be spaced apart from the first printed circuit board 310. The second printed circuit board 320 may be equipped with various active elements, passive elements, and printed circuits constituting the driving circuit. For example, the second printed circuit board 320 may include a control printed circuit board. However, embodiments of the present disclosure are not limited thereto. In an embodiment, the first printed circuit board 310 is disposed closer to the display unit 100 than the second printed circuit board 320. The first printed circuit board 310 is spaced from, but directly coupled to, the display unit 100 with connectors 510. The second printed circuit board 320 is coupled to the first printed circuit board 310 with connectors 520, and indirectly coupled to the display unit 100 via the first printed circuit board 310 and the connectors 510.

For example, the second printed circuit board 320 may be connected to an external power source and may supply electricity to the first printed circuit board 310 and the display unit 100. To this end, a circuit element 321 provided in the second printed circuit board 320 may be a relatively bulky circuit element for rectifying electricity supplied from the external power source and converting voltage thereof. For example, the second printed circuit board 320 may be provided with the element having a relatively larger volume compared to a volume of an element of the first printed circuit board 310. However, embodiments of the present disclosure are not limited thereto. In other words, in some embodiments, the second printed circuit board 320 may carry larger and more voluminous components, elements or other hardware, such as circuit element 321, relative to the first printed circuit board 310, which generally carries smaller and less voluminous components, elements or other hardware.

It may be preferred to maintain a certain spacing between the first printed circuit board 310 and the second printed circuit board 320 in the display module 10 so that the circuit element 321 provided in the second printed circuit board 320 is stably disposed while not contacting the first printed circuit board 310. The bracket 400 which will be described later may assist with maintaining the spacing between the first printed circuit board 310 and the second printed circuit board 320 in the display module 10.

The printed circuit board 300 may further include the first connector 510 and the second connector 520. The first connector 510 may be configured to electrically connect the display unit 100 and the first printed circuit board 310 to each other and to be bent.

The second connector 520 may be configured to electrically connect the first printed circuit board 310 and the second printed circuit board 320 to each other and to be bent. Each of the first connector 510 and the second connector 520 may include at least one or a plurality of connectors. In an embodiment, there are more, less, or the same number of first connectors 510 relative to the number of second connectors 520.

A portion of the driving circuit may be disposed on each of the first connector 510 and the second connector 520. Each of the first connector 510 and the second connector 520 may be made of a flexible material that may be easily bent. For example, each of the first connector 510 and the second connector 520 may be formed of a flexible polymer film. For example, the flexible polymer film may be made of any one of polyimide (PI), polyethylene terephthalate (PET), acrylonitrile-butadiene-styrene copolymer (ABS), polymethyl methacrylate (PMMA), polyethylene naphthalate (PEN), polycarbonate (PC), polyethersulfone (PES), polyarylate (PAR), polysulfone (PSF), cyclic olefin copolymer (COC), triacetylcellulose (TAC), polyvinyl alcohol (PVA), and polystyrene (PS), and the present disclosure is not limited thereto. Each of the first connector 510 and the second connector 520 may be maintained in a bent form when being mounted on the bracket 400.

Figure 4:
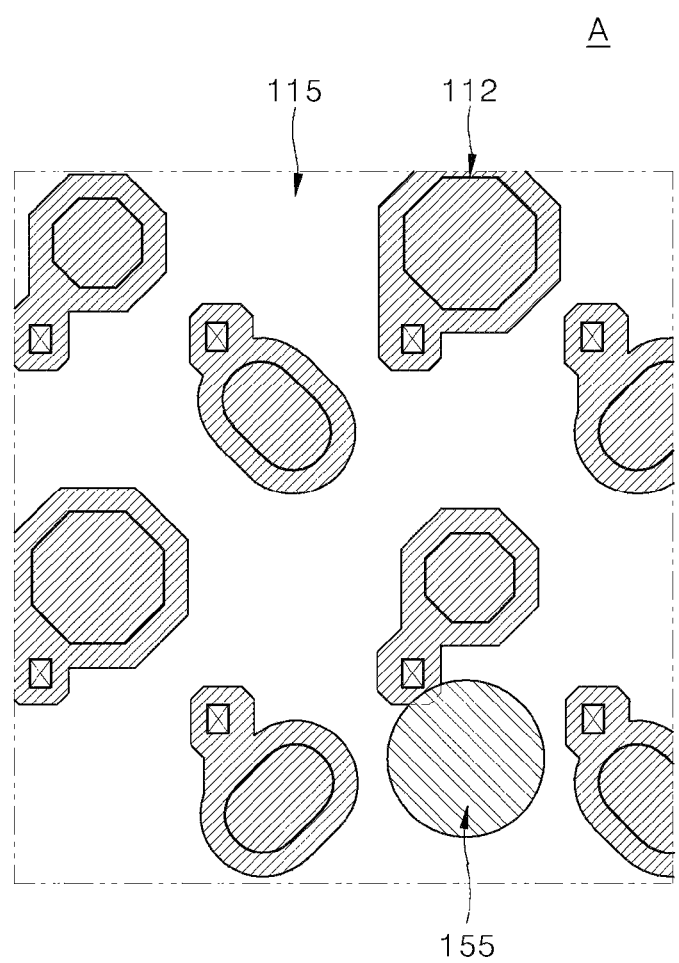
FIG. 4 is an enlarged view of area A in FIG. 3 according to an embodiment of the present disclosure.

FIG. 4 is an enlarged view of an area A of a portion of the display panel 1 of the display unit 100. FIG. 4 shows a plan view of sub-pixels arranged in a display area of the display panel 1.

Referring to FIG. 4, the display panel 1 may include a plurality of first electrodes 112 arranged in the display area, and a bank 115 may fill an area between adjacent first electrodes 112. The bank 115 may be disposed to cover an edge of the first electrode 112. A light-emitting area of the sub-pixel may be defined by making a middle area of the first electrode 112 in contact with a light-emitting stack, for example, the light-emitting area of the sub-pixel may be defined by making only the middle area of the first electrode 112 in contact with the light-emitting stack. The bank 115 may be formed of an opaque material to reduce color mixture between the plurality of sub pixels SP and for example, may be formed of black resin, but is not limited thereto. A spacer 155 may be disposed in a portion of the area where the bank 115 is disposed. The spacers 155 may be arranged to have a predefined arrangement density throughout the display panel 1. The spacer 155 may serve to support a deposition mask which blocks or opens an organic layer of each sub-pixel in performing a deposition process to form the light-emitting stack such that the deposition mask may be prevented from directly contacting the display panel 1. FIG. 4 shows an example of a Pentile type planar structure in which sub-pixels are arranged in a dot shape. However, embodiments of the present disclosure are not limited thereto. For example, the bank 115 may include an insulating material. As an example, the bank 115 may include an organic insulating material such as acryl resin, epoxy resin, phenolic resin, polyamide resin, and/or polyimide resin, etc. Alternatively, the bank 115 may include an inorganic insulating material such as silicon nitride, aluminum nitride, zirconium nitride, titanium nitride, hafnium nitride, tantalum nitride, silicon oxide, aluminum oxide, or titanium oxide, etc.

FIG. 5 is a cross-sectional view as taken along line I-I' in FIG. 3 according to an embodiment of the present disclosure to provide more detail regarding the layer stack of the display panel 1 and the connection to one of the first connectors 510.

Referring to FIG. 5, the display panel 1 of the display apparatus 1000 according to an embodiment of the present disclosure includes a substrate 101, a thin-film transistor T, a planarization layer 107, a light-emitting element 120, the bank 115, a pad 140, a dam 130, an encapsulation portion 150, and a touch unit 160.

The thin-film transistor T is disposed on the substrate 101. The thin-film transistor T transmits data voltage to a plurality of sub-pixels.

The substrate 101 supports various components of the display panel 1. The substrate 101 may be made of a transparent insulating material, such as glass or plastic. When the substrate 101 is made of plastic, the substrate may be referred to as a plastic film or plastic substrate. For example, the substrate 101 may be in a form of a film including one of polyimide-based polymers, polyester-based polymers, silicone-based polymers, acrylic polymers, polyolefin-based polymers, and copolymers thereof. However, embodiments of the present disclosure are not limited thereto. For example, since polyimide is material that can be applied to a high temperature process and can be coated may be used as a material of a plastic substrate. The substrate (array substrate) may include elements and functional layers formed on the substrate 101, such as a switching TFT, a driving TFT connected to the switching TFT, the light-emitting element 120 connected to the driving TFT, and the encapsulation portion 150. However, embodiments of the present disclosure are not limited thereto.

A buffer layer may be disposed on the substrate 101. The buffer layer may protect the thin-film transistor (TFT) from impurities such as alkali ions leaking from the substrate 101 or underlying layers. The buffer layer may be made of one or more layers of silicon oxide (SiOx), and/or silicon nitride (SiNx). For example, the buffer layer may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto. However, the buffer layer may be omitted depending on a type of the substrate 101 or a type of the thin film transistor, embodiments of the present disclosure are not limited thereto.

The thin-film transistor T may be disposed on the substrate 101 or the buffer layer. The thin-film transistor T may include an active layer 102, a gate insulating layer 103, a gate electrode 104, an interlayer insulating layer 105, a source electrode 106, and a drain electrode 108. The active layer 102 is disposed on the substrate 101 or the buffer layer.

The active layer 102 may be formed of a semiconductor material, such as an oxide semiconductor material, amorphous semiconductor material, polycrystalline semiconductor material, or organic semiconductor material, but are not limited thereto.

The oxide semiconductor material may have an excellent effect of preventing a leakage current and relatively inexpensive manufacturing cost. The oxide semiconductor may be made of a metal oxide such as zinc (Zn), indium (In), gallium (Ga), tin (Sn), and titanium (Ti) or a combination of a metal such as zinc (Zn), indium (In), gallium (Ga), tin (Sn), or titanium (Ti) and its oxide. Specifically, the oxide semiconductor may include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), indium zinc oxide (IZO), indium gallium tin oxide (IGTO), and indium gallium oxide (IGO), but is not limited thereto.

The polycrystalline semiconductor material has a fast movement speed of carriers such as electrons and holes and thus has high mobility, and has low energy power consumption and superior reliability. The polycrystalline semiconductor may be made of polycrystalline silicon (poly-Si), but is not limited thereto.

The amorphous semiconductor material may be made of amorphous silicon (a-Si), but is not limited thereto.

The organic semiconductor material may include metal-organic compounds, but is not limited thereto.

For example, in case that the active layer 102 may be made of polysilicon (p-Si), a predetermined area thereof may be doped with impurities. Furthermore, the active layer 102 may be made of amorphous silicon (a-Si), or may be made of various organic semiconductor materials such as pentacene. Alternatively, the active layer 102 may be made of oxide. embodiments of the present disclosure are not limited thereto in terms of the material constituting the active layer 102. The active layer 102 may be a semiconductor layer. However, the present disclosure is not limited to the terms as used herein.

Depending on a structure of the thin-film transistor T, the gate electrode 104 may be disposed on top of or under the active layer 102. For example, the thin-film transistor T may be a bottom gate type or a dual gate type. The gate electrode 104 may be made of each of various conductive materials, such as magnesium (Mg), aluminum (Al), nickel (Ni), titanium (Ti), chromium (Cr), molybdenum (Mo), tungsten (W), gold (Au), or alloys thereof, etc. However, embodiments of the present disclosure are not limited thereto.

The gate insulating layer 103 may be disposed between the active layer 102 and the gate electrode 104. The gate insulating layer 103 may be a layer for electrically insulating the gate electrode 104 and the active layer 102 from each other, and may be made of an insulating material. For example, the gate insulating layer 103 may be formed as a single or more layers made of silicon oxide (SiOx) and/or silicon nitride (SiNx). For example, the gate insulating layer 103 may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto. However, the present disclosure is not limited thereto. The gate insulating layer 103 may be a first insulating layer. However, embodiments of the present disclosure are not limited thereto.

The source electrode 106 and the drain electrode 108 that are electrically connected to the active layer 102 and are spaced apart from each other may be disposed on the interlayer insulating layer 105. Each of the source electrode 106 and the drain electrode 108 may be made of a conductive material, for example, copper (Cu), aluminum (Al), molybdenum (Mo), titanium (Ti), or an alloy thereof. However, the present disclosure is not limited thereto. The interlayer insulating layer 105 may be a second insulating layer and may be made of an insulating material. For example, the interlayer insulating layer 105 may be formed as a single or more layers made of silicon oxide (SiOx) and/or silicon nitride (SiNx). For example, the interlayer insulating layer 105 may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto. However, embodiments of the present disclosure are not limited thereto.

According to the structure of the thin-film transistor T, in order to electrically insulate the gate electrode 104 and each of the source electrode 106 and the drain electrode 108, an interlayer insulating layer 105 may be further disposed between the gate electrode 104 and each of the source electrode 106 and the drain electrode 108. However, the present disclosure is not limited thereto.

The planarization layer 107 may be disposed on the thin-film transistor T. The planarization layer 107 protects the thin-film transistor T and planarizes a portion on top of the thin-film transistor T. The planarization layer 107 may be disposed in a display area AA. The planarization layer 107 may not be disposed in an entirety or a portion of a non-display area NA. For example, the planarization layer 107 may be formed in various shapes. The planarization layer 107 may be composed of an organic insulating film made of, for example, BCB (Benzocyclobutene) or acryl, or an inorganic insulating film such as a silicon nitride film (SiNx) or a silicon oxide film (SiOx). For example, the planarization layer 107 may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto. The planarization layer 107 may be formed as a single layer or double or multiple layers. That is, various modifications may be applied to the planarization layer 107. embodiments of the present disclosure are not limited thereto. The planarization layer 107 may receive therein a contact hole CH for electrically connecting the thin-film transistor T and the light-emitting element 120 to each other. The planarization layer 107 may be a third insulating layer or a protective layer. However, embodiments of the present disclosure are not limited thereto.

The light-emitting element 120 is disposed on the planarization layer 107. The light-emitting element 120 may be a self-light-emitting element that emits light by itself, and may operate upon receiving voltage from a transistor, etc. The light-emitting element 120 may include a first electrode 112, a light-emitting layer 114, and a second electrode 116.

For example, the light-emitting element 120 may include the first electrode 112 formed on the planarization layer 107, the light-emitting layer 114 disposed on the first electrode 112, and the second electrode 116 disposed on the light-emitting layer 114. For example, the light-emitting element 120 may be a self-light-emitting element that emits light by itself, and may operate upon receiving voltage from the thin-film transistor T, etc.

The first electrode 112 may be electrically connected to the drain electrode 108 of the driving thin-film transistor T via the contact hole CH. The first electrode 112 may be made of a conductive material capable of supplying holes to the light-emitting layer 114. When the display panel 1 is of a top emission type, the first electrode 112 may be made of an opaque conductive material with high reflectivity. For example, the first electrode 112 may be made of silver (Ag), aluminum (Al), gold (Au), molybdenum (Mo), tungsten (W), chromium (Cr), or an alloy thereof. embodiments of the present disclosure are not limited thereto.

The bank 115 is disposed on the first electrode 112 and the planarization layer 107. The bank 115 may act as an insulating layer to distinguish adjacent sub-pixels from each other. The bank 115 may be disposed to open a portion of the first electrode 112. The bank 115 may be made of an organic insulating material and may be disposed to cover an edge of the first electrode 112. However, embodiments of the present disclosure are not limited thereto.

The bank 115 is formed in a remaining area excluding the light-emitting area EA. Accordingly, the bank 115 may have a bank hole defined therein that exposes a portion of the first electrode 112 corresponding to the light-emitting area. The bank 115 may be made of an inorganic insulating material such as silicon nitride (SiNx) or silicon oxide (SiOx), or an organic insulating material such as BCB, acrylic resin, or imide resin. However, embodiments of the present disclosure are not limited thereto.

The light-emitting layer 114 is disposed on the portion of the first electrode 112 not covered with the bank 115 so as to be exposed. The light-emitting layer 114 may include a light-emitting layer, an electron injection layer, an electron transport layer, an electron blocking layer, a hole transport layer, a hole blocking layer, and a hole injection layer. However, embodiments of the present disclosure are not limited thereto. The light-emitting layer may be composed of a single light-emitting layer structure that emits light of a single color, or may be composed of a plurality of light-emitting layers such that white light is emitted as a mixture of light beams respectively emitted from the plurality of light-emitting layers. A charge generation layer may be further disposed between adjacent ones of the plurality of light-emitting layers.

Referring to FIG. 5, it is shown that the light-emitting layers 114 respectively disposed in the sub-pixels are disconnected from each other. However, the present disclosure is not limited thereto. For example, the light-emitting layer 114 may be formed as a single layer across the plurality of sub-pixels or across some of the plurality of sub-pixels.

The second electrode 116 may be disposed on the light-emitting layer 114. The second electrode 116 may be made of a conductive material that may supply electrons to the light-emitting layer 114. For example, the second electrode 116 may be made of a transparent conductive oxide such as indium tin zinc oxide (ITZO), zinc oxide (ZnO), and tin oxide (TO), or ytterbium (Yb) alloy. However, embodiments of the present disclosure are not limited thereto. The second electrode 116 may be formed as a very thin film made of a metal material. However, the present disclosure is not limited thereto. When the display panel 1 is of a top emission type, the second electrode 116 may be made of a transparent conductive material such as indium tin oxide (ITO) or indium zinc oxide (IZO), or a transflective metal alloy such as MgAg alloy, such that the light generated from the light-emitting layer 114 may be emitted upwardly of the second electrode 116.

Referring to FIG. 5, it is shown that the second electrodes 116 respectively disposed in the sub-pixels are connected to each other. However, the present disclosure is not limited thereto. Like the first electrode 112, the second electrodes 116 respectively disposed in the sub-pixels may be disconnected from each other. However, the present disclosure is not limited thereto.

The light-emitting layer 114 may be an organic light-emitting layer made of organic material. However, the present disclosure is not limited thereto. For example, the light-emitting layer 114 may be an inorganic light-emitting layer including an inorganic semiconductor layer, such as a quantum dot material, or an organic-inorganic mixed light-emitting layer. In some cases, the light-emitting layer 114 may have an arrangement of micro LEDs or mini LEDs.

The display area AA may include a plurality of light-emitting areas EA and a non-light-emitting area NEA between adjacent ones of the plurality of light-emitting areas EA.

An area where each of the plurality of light-emitting elements 120 is disposed may be each of the plurality of light-emitting areas EA. Each of the plurality of light-emitting areas EA may be an area that may independently emit light of one color, and may be an area corresponding to a plurality of sub-pixels, and may be an area where the bank 110 is not disposed. For example, the plurality of light-emitting areas EA may include, but is not limited to, a red light-emitting area, a green light-emitting area, and a blue light-emitting area. The plurality of light-emitting areas EA may be arranged so as to be spaced apart from each other. For example, the plurality of light-emitting areas EA may be arranged in a row direction and a column direction, and thus may be arranged in a matrix form. However, the present disclosure is not limited thereto. The plurality of light-emitting areas EA correspond to the plurality of sub pixels SP.

The sub pixel SP is a minimum unit which configures a screen and each of the plurality of sub pixels SP may emit light having different wavelengths from each other. The plurality of sub pixels SP may include a red sub pixel SPR which is a first sub pixel, a green sub pixel SPG which is a second sub pixel, and a blue sub pixel SPB which is a third sub pixel. Alternatively, the plurality of sub pixels SP may also further include a white sub pixel. For example, the plurality of sub pixels SP may include red, green, and blue sub-pixels, in which the red, green, and blue sub-pixels may be disposed in a repeated manner. Alternatively, the plurality of sub pixels SP may include red, green, blue, and white sub-pixels, in which the red, green, blue, and white sub-pixels may be disposed in a repeated manner, or the red, green, blue, and white sub-pixels may be disposed in a quad type. For example, the red sub pixel, the blue sub pixel, and the green sub pixel may be sequentially disposed along a row direction, or the red sub pixel, the blue sub pixel, the green sub pixel and the white sub pixel may be sequentially disposed along the row direction.

However, in the embodiment of the present disclosure, the color type, disposition type, and disposition order of the sub-pixels are not limiting, and may be configured in various forms according to light-emitting characteristics, device lifespans, and device specifications.

Meanwhile, the sub-pixels may have different light-emitting areas according to light-emitting characteristics. For example, a sub-pixel that emits light of a color different from that of a blue sub-pixel may have a different light-emitting area from that of the blue sub-pixel. For example, the red sub-pixel, the blue sub-pixel, and the green sub-pixel, or the red sub-pixel, the blue sub-pixel, the white sub-pixel, and the green sub-pixel may each has a different light-emitting area.

An area in which the plurality of light-emitting element 120 is not disposed may be the non-light-emitting area NEA. The non-light-emitting area NEA may be an area disposed between adjacent ones of the plurality of light-emitting areas EA and may be an area where the bank 110 is disposed. Since the non-light-emitting area NEA is disposed to surround the plurality of light-emitting areas EA, the non-light-emitting area NEA may be in a form of a mesh. However, embodiments of the present disclosure are not limited thereto.

The dam 130 is disposed in the non-display area NA. For example, the dam 130 may be disposed on the substrate 101 and disposed in the non-display area NA. The dam 130 may be disposed to prevent spread of a material of an organic encapsulation layer 152 of the encapsulation portion 150 disposed to cover the display area AA. For example, the dam 130 may suppress overflow of the material of the organic encapsulation layer 152 of the encapsulation portion 150. One or more dams 130 may be disposed, and the number of dams disposed is not limited to a specific number.

The pad 140 is disposed in the non-display area NA. The pad 140 may be disposed outside the dam 130. A signal may be input to a circuit area or a circuit chip formed in the substrate 101 via the pad 140. For example, the pad 140 may supply a signal supplied from an external source to the circuit area, the circuit chip, etc., of the substrate 101. For example, the pad 140 may supply a signal for driving the touch unit 160 to the touch unit 160 and receive a signal resulting from a user's touch input from the touch unit 160.

The encapsulation portion 150 is disposed on the light-emitting element 120. The encapsulation portion 150 may act as a sealing member that protects the light-emitting material and the electrode material of the light-emitting element 120 from external moisture, oxygen, shock, etc., in order to prevent oxidation of the light-emitting material and the electrode material of the light-emitting element 120. The encapsulation portion 150 may be disposed to cover an entirety of the display area AA where the light-emitting element 120 is disposed. The encapsulation portion 150 may be disposed to cover a portion of the non-display area NA extending from the display area AA. The encapsulation portion 150 may include a first inorganic encapsulation layer 151 which is made of an inorganic material, the organic encapsulation layer 152 made of an organic material and disposed on the first inorganic encapsulation layer 151, and a second inorganic encapsulation layer 153 disposed on the organic encapsulation layer 152. However, embodiments of the present disclosure are not limited thereto.

The first inorganic encapsulation layer 151 seals the display area AA and prevents oxygen and moisture from penetrating into the display area AA to protect the light-emitting element 120. The first inorganic encapsulation layer 151 may be disposed not only in the display area AA, but also in the non-display area NA extending from the display area AA, and thus may be disposed to cover the dam 130 of the non-display area NA. The first inorganic encapsulation layer 151 may be made of an inorganic material, for example, silicon nitride (SiNx), silicon oxide (SiOx), silicon oxynitride (SiON), etc. For example, the first inorganic encapsulation layer 151 may include an inorganic insulating film such as a silicon nitride (SiNx) film, a silicon oxide (SiOx) film, a silicon oxynitride (SiON) film, etc. For example, the first inorganic encapsulation layer 151 may be formed by inorganic film in a single layer or in multiple layers, for example, the inorganic film in a single layer may be a silicon nitride (SiNx) film, a silicon oxide (SiOx) film, a silicon oxynitride (SiON) film, etc., and inorganic films in multiple layers may formed by alternately stacking one or more of one or more silicon nitride (SiNx) films, one or more silicon oxide (SiOx) films, and one or more silicon oxynitride (SiON) films, and one or more amorphous silicon (a-Si). However, the present disclosure is not limited thereto.

The organic encapsulation layer 152 is disposed on the first inorganic encapsulation layer 151. The organic encapsulation layer 152 may planarize a portion on top of the first inorganic encapsulation layer 151, and may fill cracks that may occur in the first inorganic encapsulation layer 151. When a foreign material is deposited on the first inorganic encapsulation layer 151, the organic encapsulation layer 152 may planarize a portion on top of the foreign material. The organic encapsulation layer 152 may be disposed in the display area AA and in a portion of the non-display area NA extending from the display area AA, and may be disposed inwardly of the dam 130. The organic encapsulation layer 152 may be made of an organic insulating material, such as an epoxy-based or acryl-based polymer, including but not limited to acrylic resin, epoxy resin, polyimide, polyethylene and silicon oxycarbide (SiOC). However, the present disclosure is not limited thereto.

The second inorganic encapsulation layer 153 is disposed on the organic encapsulation layer 152. The second inorganic encapsulation layer 153 is in contact with the first inorganic encapsulation layer 151 in an outer area of the display unit 100 such that the second inorganic encapsulation layer 153 together with the first inorganic encapsulation layer 151 may seal the organic encapsulation layer 152. The second inorganic encapsulation layer 153 may be disposed in a portion of the non-display area NA extending from the display area AA. The second inorganic encapsulation layer 153 may be disposed so as to be in contact with a portion of the first inorganic encapsulation layer 151 disposed in the non-display area NA. The second inorganic encapsulation layer 153 may be made of an inorganic material, for example, silicon nitride (SiNx), silicon oxide (SiOx), silicon oxynitride (SiON), etc. For example, the second inorganic encapsulation layer 153 may include an inorganic insulating film such as a silicon nitride (SiNx) film, a silicon oxide (SiOx) film, a silicon oxynitride (SiON) film, etc. For example, the second inorganic encapsulation layer 153 may be formed by inorganic film in a single layer or in multiple layers, for example, the inorganic film in a single layer may be a silicon nitride (SiNx) film, a silicon oxide (SiOx) film, a silicon oxynitride (SiON) film, etc., and inorganic films in multiple layers may formed by alternately stacking one or more of one or more silicon nitride (SiNx) films, one or more silicon oxide (SiOx) films, and one or more silicon oxynitride (SiON) films, and one or more amorphous silicon (a-Si). However, the present disclosure is not limited thereto.

In FIG. 5, the encapsulation portion 150 is shown as including the first inorganic encapsulation layer 151, the organic encapsulation layer 152, and the second inorganic encapsulation layer 153. However, the number of the inorganic encapsulation layers 151 and 153 included in the encapsulation portion 150 and the number of the organic encapsulation layers 152 included in the encapsulation portion 150 are not limited thereto. For example, the encapsulation portion 150 may include n layers alternately laminated between inorganic encapsulation layer and organic encapsulation layer (where n is an integer greater than or equal to 3).

The touch unit 160 is disposed on the encapsulation portion 150. The touch unit 160 may be disposed in the display area AA including the light-emitting element 120 and may sense a touch input. The touch unit 160 may detect external touch information input thereto using the user's finger or a touch pen. The touch unit 160 may include a first protection layer 161, a second protection layer 162, an organic insulating layer 167, a first touch electrode 164, and a second touch electrode 165.

The first protection layer 161 may be disposed on the encapsulation portion 150. The first protection layer 161 may be in contact with the second inorganic encapsulation layer 153 of the encapsulation portion 150. The first protective layer 161 may be made of inorganic material. For example, the first protective layer 161 may be made of an inorganic material such as silicon nitride (SiNx), silicon oxide (SiOx), silicon oxynitride (SiONx), etc. For example, the first protection layer 161 may include an inorganic insulating film such as a silicon nitride (SiNx) film, a silicon oxide (SiOx) film, a silicon oxynitride (SiON) film, etc. For example, the first protection layer 161 may be formed by inorganic film in a single layer or in multiple layers, for example, the inorganic film in a single layer may be a silicon nitride (SiNx) film, a silicon oxide (SiOx) film, a silicon oxynitride (SiON) film, etc., and inorganic films in multiple layers may formed by alternately stacking one or more of one or more silicon nitride (SiNx) films, one or more silicon oxide (SiOx) films, and one or more silicon oxynitride (SiON) films, and one or more amorphous silicon (a-Si). However, embodiments of the present disclosure are not limited thereto.

The first touch electrode 164 is disposed on the first protection layer 161. The first touch electrode 164 is disposed in the non-light-emitting area NEA and disposed on the first protection layer 161. The first touch electrode 164 may include patterns spaced apart from each other and arranged in the X-axis direction and the Y-axis direction. For example, the first touch electrode 164 may include a plurality of patterns spaced apart from each other and arranged in the X-axis direction and a plurality of patterns spaced apart from each other and arranged in the Y-axis direction. The first touch electrode 164 supplies a touch driving signal to drive the touch unit 160. Furthermore, the first touch electrode 164 may transmit touch information detected by the touch unit 160 to a driving IC. The first touch electrode 164 may be in a form of a mesh. However, the present disclosure is not limited thereto. The first touch electrode 164 may be made of a metal material. However, the present disclosure is not limited thereto.

The second protection layer 162 may be disposed on the first touch electrode 164 and the first protection layer 161. The second protection layer 162 may prevent short-circuit between patterns of the first touch electrode 164 adjacent to each other.

The second touch electrode 165 may be disposed on the second protection layer 162. The second protective layer 162 may be made of inorganic material. For example, the second protective layer 162 may be made of an inorganic material such as silicon nitride (SiNx), silicon oxide (SiOx), or silicon oxynitride (SiONx). For example, the second protective layer 162 may include an inorganic insulating film such as a silicon nitride (SiNx) film, a silicon oxide (SiOx) film, a silicon oxynitride (SiON) film, etc. For example, the second protective layer 162 may be formed by inorganic film in a single layer or in multiple layers, for example, the inorganic film in a single layer may be a silicon nitride (SiNx) film, a silicon oxide (SiOx) film, a silicon oxynitride (SiON) film, etc., and inorganic films in multiple layers may formed by alternately stacking one or more of one or more silicon nitride (SiNx) films, one or more silicon oxide (SiOx) films, and one or more silicon oxynitride (SiON) films, and one or more amorphous silicon (a-Si). However, the present disclosure is not limited thereto.

The pad 140 and the second touch electrode 165 may be electrically connected to the first connector 510 via a conductive adhesive layer 395. Except as otherwise noted in the above description regarding FIG. 5, the described layers of the stack of the display panel 1 may be disposed directly on the other layers in some embodiments, such as in the arrangement shown in FIG. 5. In other words, each of the layers illustrated in FIG. 5 may be disposed directly on the other layers according to the illustration and order of the layers in FIG. 5 in some embodiments, although the disclosure is not limited thereto and additional intervening layers may be present in some embodiments.

Figure 6:
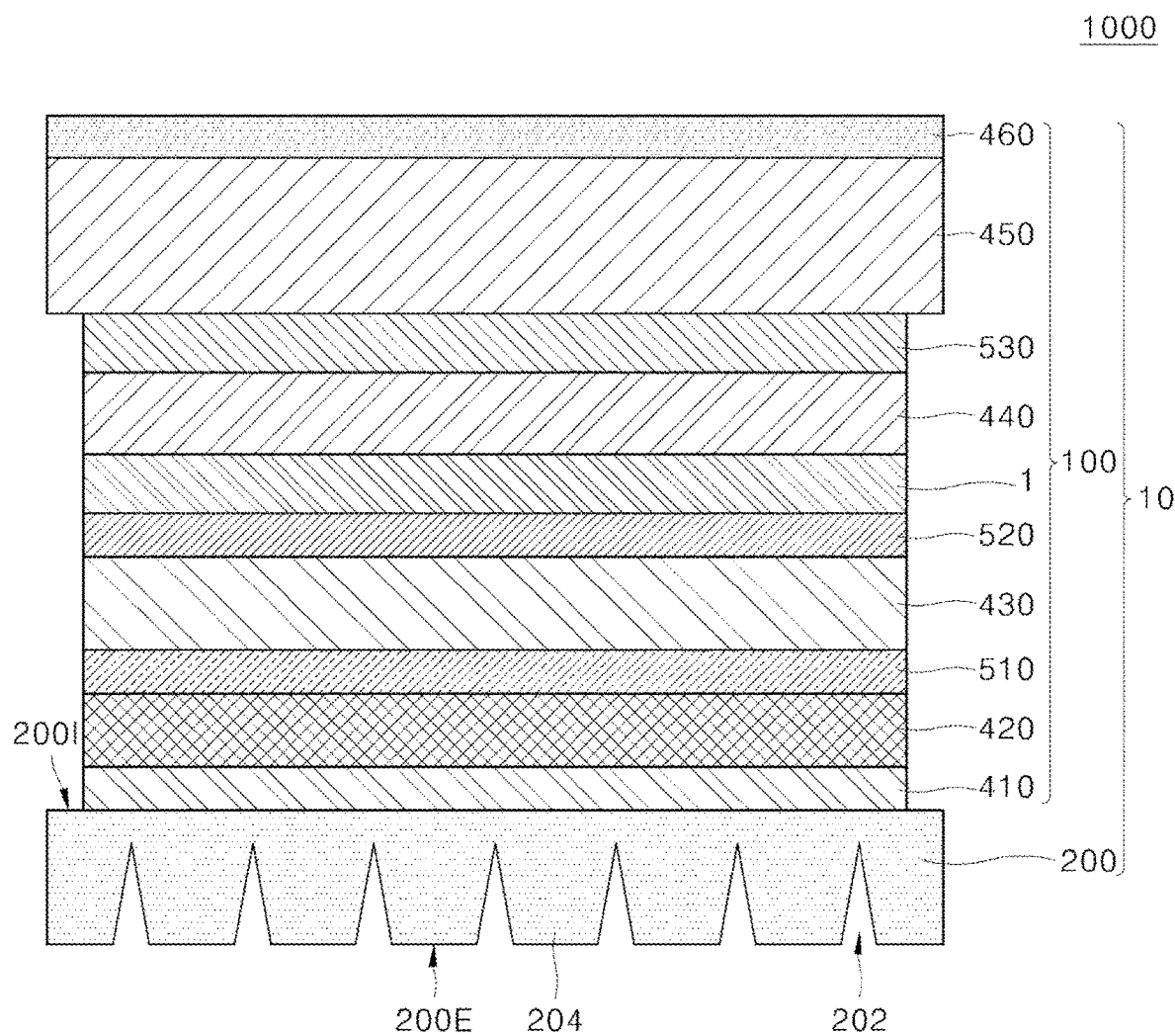
FIG. 6 is a cross-sectional view along line II-II' in FIG. 2 of a portion of a display apparatus according to an embodiment of the present disclosure.

FIG. 6 is a cross-sectional view along line II-II' in FIG. 2 showing constituent layers of the display unit 100 and the first guide member 200 of the display apparatus 1000 according to an embodiment of the present disclosure. The display module 10 may include, for example, the display unit 100 and the first guide member 200. Referring to FIG. 6, the first guide member 200 may constitute the lowest portion or outermost portion of the display module 10. Then, a tape 410, a bottom plate 420, a first adhesive layer 510, a support member 430, and a second adhesive layer 520 may be disposed sequentially on the first guide member 200. The first guide member 200 may be disposed to ensure that the display module 10 is uniformly bent and returned to a flat state portion-by-portion.

Referring to FIG. 6, a cross section of each of portions of the first guide member 200 may be in a form of a trapezoid in which an internal surface 200I of the first guide member 200 adjacent to the display panel 1 may be maintained in a flat state, while the other exterior surface 200E opposite thereto of the first guide member 200 is partially removed. When the portion of the other surface of the first guide member 200 has been removed as shown in the cross section in FIG. 6, the first guide member 200 may be bent so as to be rolled into a cylindrical shape or be returned to a flat state while the display panel 1 is visible. In an embodiment, the first guide member 200 is a solid and continuous plate, and a plurality of channels or grooves 202 are formed in the exterior surface 200E of the first guide member 200, such as by cutting, stamping, etching, or another like process, to create generally trapezoidal shaped guide elements 204. Thus, the channels or grooves 202 provide a space between each guide element 204 that allows the exterior surface 200E to roll or bend. During the rolling or bending process, the guide elements 204 move closer to each other (or into contact with each other) to reduce or eliminate the space between the guide elements 204. A size, shape, location and other characteristics of the channels or grooves 202 can be selected to vary the radius of curvature of the first guide member 200 in a rolled or bent configuration.

In an embodiment, each of the channels 202 has a similar size and shape being a triangular cut to define angled or tapered sidewalls in the guide elements 204 with the channels 202 being spaced equidistant from each other, although the same is not required. In an embodiment, the channels 202 have different features and spacing from each other and characteristics of the channels 202 are generally selected according to the desired radius of curvature or bending characteristics of the first guide member 200. It is also noted that each of the guide elements 204 are connected to each other by a solid and continuous portion (i.e., without channels 202 or other openings) of the first guide member 200 to provide support to the display unit 100 and display module 10 as a whole. Portions of the first guide member 200, such as portions that are not rolled or bent, may not include the channels or grooves 202 and may instead be solid and continuous to provide additional support to the display module 10. For example, at least an upper portion of the first guide member 200 shown in FIG. 7 and may not include the channels or grooves 202.

The tape 410 may help the first guide member 200 maintain a constant spacing between the trapezoid portions (i.e., guide elements 204) thereof while not being deformed. The bottom plate 420 and the first adhesive layer 510 may be disposed on the tape 410. The bottom plate 420 may be disposed to absorb tensile and compressive stresses applied to the display panel 1 when the first guide member 200 is bent or returned to a flat state. For example, the tape 410 may be embodied as a foam tape. However, embodiments of the present disclosure are not limited thereto.

The bottom plate 420 may be made of, for example, hard plastic, and may be made of a transparent material such as polyethylene terephthalate (PET). However, embodiment of the present disclosure are not limited thereto.

The first adhesive layer 510 may contain a black dye rendering black to block light emitted from the display panel 1. The first adhesive layer 510 containing the black dye may absorb and block the light emitted from the display panel 1 to prevent light from spreading throughout the display module 10, and may have an adhesive function.

The support member 430 may be bonded to a lower layer of the display panel 1 via the second adhesive layer 520. The support member 430 may be, for example, a back plate. However, embodiments of the present disclosure are not limited thereto.

A polarizing plate 440, a third adhesive layer 530, a cover member 450, and the protective film 460 may be sequentially stacked on the display panel 1.

The polarizing plate (for example, polarizer) 440 may be disposed to prevent external light from being incident and reflected on and from the display panel 1 so as to be visible to the user.

The cover member 450 may be embodied as a glass or plastic-based substrate to protect the display panel 1. The cover member 450 may be embodied as a foldable or bendable glass substrate. The polarizing plate 440 may be omitted in some embodiments. However, embodiments of the present disclosure are not limited thereto.

The protective film 460 may protect the display panel 1 and the cover member 450. For example, when the display panel 1 and/or the cover member 450 are damaged due to an external impact, fragments resulting from the damage may scatter and cause injury to the user. The protective film 460 may primarily absorb the shock to prevent the fragments damaged by the external shock from scattering. Secondly, in order to prevent the fragments from scattering, the protective film 460 may have adhesiveness and durability to hold and retain the fragments.

Figure 7:
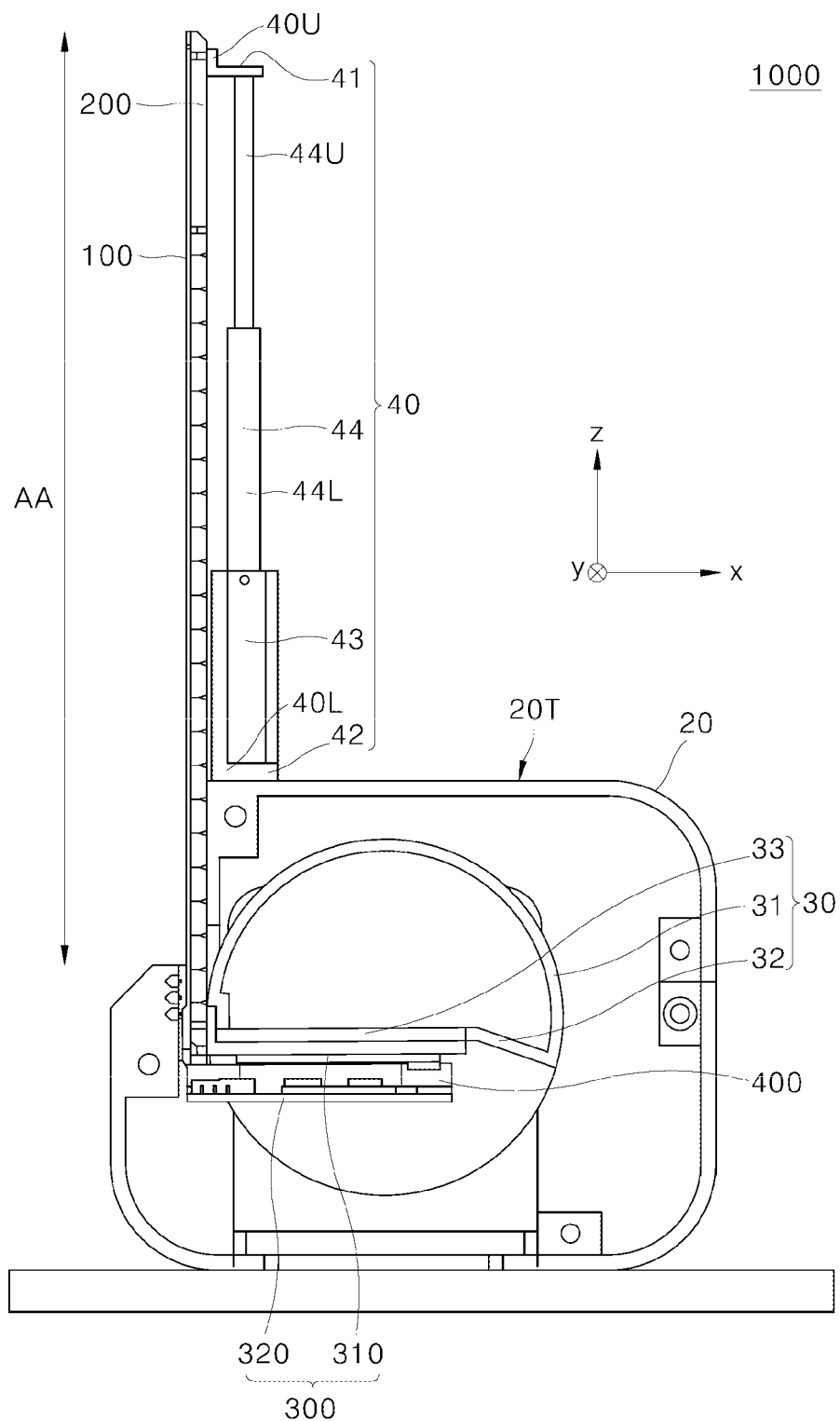
FIG. 7 is a side cross-sectional view of a display apparatus in an unrolled configuration according to an embodiment of the present disclosure.

FIG. 7 is a side cross-sectional view of the display apparatus 1000 in an unrolled configuration according to an embodiment of the present disclosure.

Figure 8:
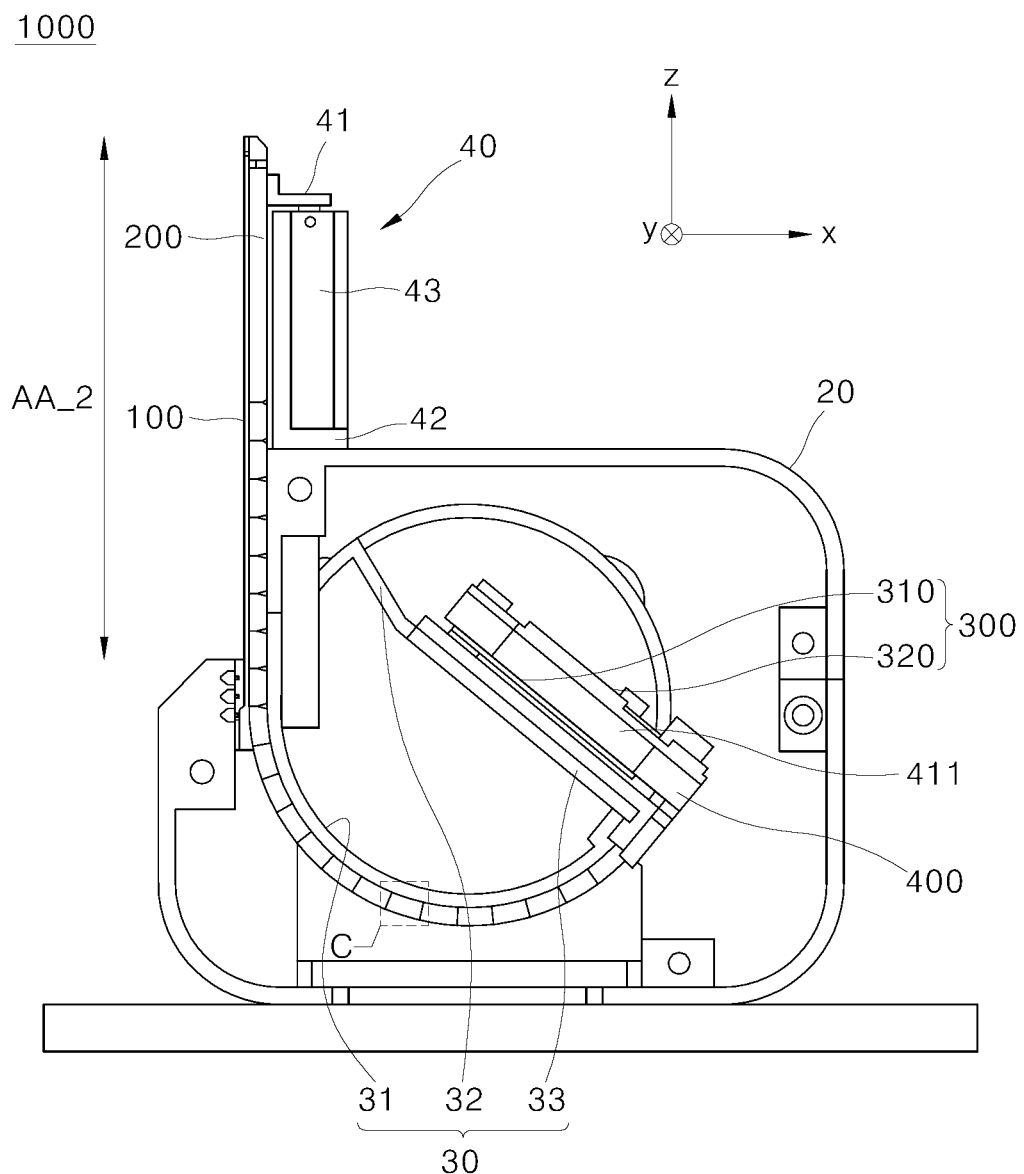
FIG. 8 is a side cross-sectional view of the display apparatus of FIG. 7 in a rolled configuration.

FIG. 8 is a side cross-sectional view of the display apparatus 1000 in a rolling configuration in which a portion of the display unit 100 and a portion of the first guide member 200 in FIG. 7 are accommodated in the housing 20.

Referring to FIG. 1, FIG. 7, and FIG. 8, the display apparatus 1000 according to an embodiment of the present disclosure may include the display unit 100, the housing 20, the second guide member 30, the guide unit 40, and the motor 50.

The housing 20 may accommodate therein at least a portion of the display unit 100. For example, the housing 20 may be installed in an embedded manner in the dashboard of the vehicle. Each of the display unit 100 and the first guide member 200 may be installed so that at least a portion thereof may not be covered with the dashboard so as to be exposed to an outside. An area size of a portion of each of the display unit 100 and the first guide member 200 accommodated in the housing 20 may vary.

Referring to FIG. 7 and FIG. 8, a size of a display area (active area AA) of the display apparatus 1000 may vary depending on a vertical level to which the display unit 100 is raised or lowered as well as a size of the display apparatus 1000 generally. In the display apparatus 1000, the display area of the display unit 100 may be disposed at the opposite side to the side at which the first guide member 200 is disposed. For example, as shown in FIG. 7, when the display unit 100 is raised, the area size of the display area AA may increase. For example, as shown in FIG. 8, when the display unit 100 descends, an area size of a display area AA_2 may decrease.

Referring to FIG. 1 and FIG. 7, when the display unit 100 and the first guide member 200 ascend, a portion of each of the display unit 100 and the first guide member 200 accommodated inside the housing 20 while being in a bent state is returned to a flat state again and is exposed to an outside out of the housing 20. Thus, the user may view the video or image played on the portion of the display unit 100 returned to a flat state.

Referring to FIG. 8, when the display unit 100 and the first guide member 200 descend, at least a portion of each of the display unit 100 and the first guide member 200 is bent into a curved shape in a side view so as to be accommodated inside the housing 20.

The second guide member 30 may be accommodated in the housing 20 and may be configured to rotate with respect to the housing 20, such as via motor 50. The display module 10 may be mounted on the second guide member 30. The second guide member 30 may be configured so that at least a portion of the display unit 100 and the first guide member 200 are wound therearound.

One end (or one side) of the guide unit 40, such as an upper end 40U, may be mounted on the first guide member 200 and the other end (or other side) thereof, such as a lower end 40L, may be mounted on the housing 20. The guide unit 40 may move, or may assist with moving, the display unit 100 and the first guide member 200 in the first direction to change a size of an exposed area of each of the display unit 100 and the first guide member 200.

Referring to FIG. 1 and FIG. 7, the guide unit 40 may include a connection portion 41, a frame 42, a movable support 43, a movable portion 44, and a reinforcement plate 45. The connection portion 41 may be coupled (connected) to the first guide member 200 and may move together with the first guide member 200. The connection portion 41 may have a bar shape and may also be referred to herein as a head bar 41, and a length direction of the connection portion 41 may be parallel to a second direction of the first guide member 200. In an embodiment, the connection portion 41 extends in a width direction (i.e., Y direction) of the first guide member 200 and is generally perpendicular to the direction of travel of the first guide member 200 in the Z direction. The connection portion 41 may be coupled to a top portion of a rear surface (i.e., external surface 200E in FIG. 6) of the first guide member 200.

The connection portion 41 may be configured to move up and down in the display apparatus 1000. As the connection portion 41 moves up and down, the first guide member 200 and the display unit 100 coupled to the connection portion 41 move up and down such that the size of the exposed area of each of the connection portion 41, the first guide member 200 and the display unit 100 may be changed.

The connection portion 41 may connect the first guide member 200 and the movable portion 44 to each other.

The frame 42 may be coupled to a top surface 20T of the housing 20. The frame 42 may have a bar shape, and a length direction of the frame 42 may be parallel to the second direction of the first guide member 200 (i.e., may extend in the same direction as the connection portion 41). The housing 20 may support the frame 42. The frame 42 may also be referred to herein as a support bar 42 that is spaced across the guide unit 40 in a vertical or Z direction from the connection portion 41 or head bar 41.

The movable support 43 may be formed to protrude upwardly from the frame 42. A pair of movable supports 43 may be provided. The pair of movable supports 43 may be disposed to be spaced apart from each other by a certain spacing in the second direction of the first guide member 200. A hollow space into which the movable portion 44 is mounted may be formed in the movable support 43. In other words, the movable supports 43 may be protrusions or extensions located on opposite ends of the frame 42 that are hollow or otherwise have an opening or cavity for receiving the movable portions 44. In an embodiment, the movable portions 44 are rods that telescope into and out of the cavities in the movable supports 43.

The reinforcement plate 45 may be disposed between the pair of movable supports 43 that are spaced apart from each other across the frame 42 in a width or Y direction. The reinforcement plate 45 may be coupled to the pair of movable supports 43 to maintain a set spacing between the pair of movable supports 43. The reinforcement plate 45 may be provided in a plate shape. However, embodiments of the present disclosure are not limited thereto. The reinforcement plate 45 may be formed integrally with the pair of movable supports 43. The reinforcement plate 45 may be omitted.

The frame 42, the movable support 43, and the reinforcement plate 45 may be integral with each other into one body or may be formed independently of each other. However, embodiments of the present disclosure are not limited thereto.

The movable portion 44 may have one end (or one side), such as an upper end 44U, coupled to the connection portion 41 and an opposite end, such as a lower or bottom end 44L that may be inserted (or accommodated) into the movable support 43. The movable portion 44 may be movable in a first direction, such as a Z direction, with respect to the movable support 43. The movable portion 44 may be configured to be inserted into (or accommodated in) the hollow space of the movable support 43 and to move up and down with respect to the movable support 43.

As the movable portion 44 moves up and down, the connection portion 41, the first guide member 200 coupled to the connection portion 41, and the display unit 100 coupled to the first guide member 200 may move up and down. Accordingly, the size of the area exposed to the outside of each of the first guide member 200 and the display unit 100 may be changed.

The movable portion 44 may support the display unit 100 and the first guide member 200 so that when each of the display unit 100 and the first guide member 200 moves up and down, the exposed area of each thereof is maintained in a flat state.

The motor 50 may be configured to raise and lower the display unit 100 and the first guide member 200. The movable portion 44 may be moved up and down under an operation of the motor 50. The motor 50 may be coupled to the housing 20, and a rotation shaft thereof may be coupled to the second guide member 30.

When the motor 50 rotates, the second guide member 30 rotates, and accordingly, the display unit 100 and the first guide member 200 may be wound around or unwound from the second guide member 30.

Referring to FIG. 7, when the motor 50 rotates in a direction such that the display unit 100 and the first guide member 200 are unwound from the second guide member 30, an upper end of each of the display unit 100 and the first guide member 200 ascends. Thus, the size of the area exposed to the outside of each of the display unit 100 and the first guide member 200 increases, such that the movable portion 44 coupled to the first guide member 200 ascends.

Referring to FIG. 8, on the contrary, when the motor 50 rotates in a direction such that the display unit 100 and the first guide member 200 are wound around the second guide member 30, the upper end of each of the display unit 100 and the first guide member 200 descends such that the size of the area exposed to the outside of each of the display unit 100 and the first guide member 200 decreases. Thus, the movable portion 44 coupled to the first guide member 200 may descend.

Hereinafter, the second guide member 30 is described in more detail. The second guide member 30 may include a curved portion 31, a connection portion 32, and a bridge 33. The display unit 100 and the first guide member 200 may be wound around an outer circumference of the curved portion 31. The curved portion 31 of the second guide member 30 may be formed, for example, in an arc or semicircle shape. However, embodiments of the present disclosure are not limited thereto.

A pair of curved portions 31 may be respectively provided on both opposing sides of the rear surface of the first guide member 200, meaning that the second guide member 30 may include spaced apart curved portions 31 that correspond to opposite sides of the first guide member in the width or Y direction, as best shown in FIG. 1. The pair of curved portions 31 may be spaced apart from each other in the second direction or Y direction of the display unit 100. The bridge 33 may be disposed between the pair of curved portions 31 to connect the curved portions 31 and rotate the pair of curved portions 31 together as a single, integral unit.

As the motor 50 operates such that the second guide member 30 rotates, a size of an area in which each of the display unit 100 and the first guide member 200 are wound around the curved portion 31 may vary. As shown in FIG. 7, when the top (or upper end) of each of the display unit 100 and the first guide member 200 reaches a set maximum vertical level and thus, an entirety of the display unit 100 is returned to a flat state, the area in which each of the display unit 100 and the first guide member 200 is wound around the curved portion 31 may be absent or very small.

Conversely, as shown in FIG. 8, when the second guide member 30 rotates such that the top (or upper end) of each of the display unit 100 and the first guide member 200 reaches a set minimum vertical level, the size of the area in which where each of the display unit 100 and the first guide member 200 is wound around the curved portion 31 may be maximized.

The connection portion 32 may connect both opposing ends (or both opposing sides) of the pair of curved portions 31 to each other. Like the pair of curved portions 31, a pair of connection portions 32 may be provided. The curved portion 31 and the connection portion 32 may be formed integrally with each other or may be formed independently of each other. However, the present disclosure is not limited thereto. The connection portion 32 may be formed in a plate shape. However, embodiments of the present disclosure are not limited thereto. In an embodiment, the connection portion 32 has a generally flat shape such that the second guide member 30 includes a pair of spaced apart curved portions 31 and a pair of spaced apart flat portions. The pair of spaced apart flat portions corresponding to the pair of connection portions 32 generally do not receive the display unit 100 and/or the first guide member 200 when the display apparatus 1000 is in the fully rolled configuration shown in FIG. 8. Accordingly, only a portion of the second guide member 30, and namely the pair of curved portions 31, receives the display unit 100 and the first guide member 100. Both opposing ends (or both opposing sides) of the bridge 33 may be respectively coupled to corresponding ones of the pair of connection portions 32.

The bridge 33 may be coupled to the connection portion 32 or the pair of connection portions 32. The printed circuit board 300 and the bracket 400 may be mounted on the bridge 33. The bridge 33 may be coupled to a lower end of the first guide member 200. The bridge 33 may be formed, for example, in a plate shape in order to provide a flat area for mounting the printed circuit board 300 and the bracket 400. However, embodiments of the present disclosure are not limited thereto.

A seat plate 411 of the bracket 400 may be coupled to one surface of the bridge 33, such as an outer surface, via, for example, a coupling member. The coupling member may be a screw bolt or other fastener. However, embodiments of the present disclosure are not limited thereto. According to an embodiment of the present disclosure, the first printed circuit board 310 and the second printed circuit board 320 may be seated on or otherwise disposed on the seat plate 411 of the bracket 400. A length direction of the seat plate 411 may be parallel to the second direction or Y direction of the display unit 100.

Accordingly, the bridge 33 may be formed so that a length direction of the bridge 33 is parallel to the second direction or the Y direction of the display unit 100 so as to have a shape correspond to the shape of the seat plate 411 of the bracket 400. Due to this structure, the second guide member 30 may provide a sufficient space in which the first printed circuit board 310 and the second printed circuit board 320 may be disposed.

The bracket 400 on which the first printed circuit board 310 and the second printed circuit board 320 are mounted may be coupled to the bridge 33. The first printed circuit board 310 and the second printed circuit board 320 may be seated on the bracket 400 which may be mounted on the bridge 33, so that the first printed circuit board 310 and the second printed circuit board 320 may rotate together with the rotation of the second guide member 30. In an embodiment, and as shown in FIG. 7 and FIG. 8, the first printed circuit board 310 and the second printed circuit board 320 may be disposed on opposite sides or surfaces of the seat plate 411. As such, the seat plate 411 may act as an insulating spacer between the circuit boards 310, 320 while also providing support for the circuit boards 310, 320. The seat plate 411, as well as the circuit boards 310, 320 are mounted in the space between the pair of curved portions 31 of the second guide member 30, as best shown in FIG. 1, such that the rolling and unrolling operations avoid contact between the circuit boards 310, 320, the first support member 200, and the display unit 100 and reduce the likelihood of damage to the circuit boards 310, 320 during operation.

Figure 9:
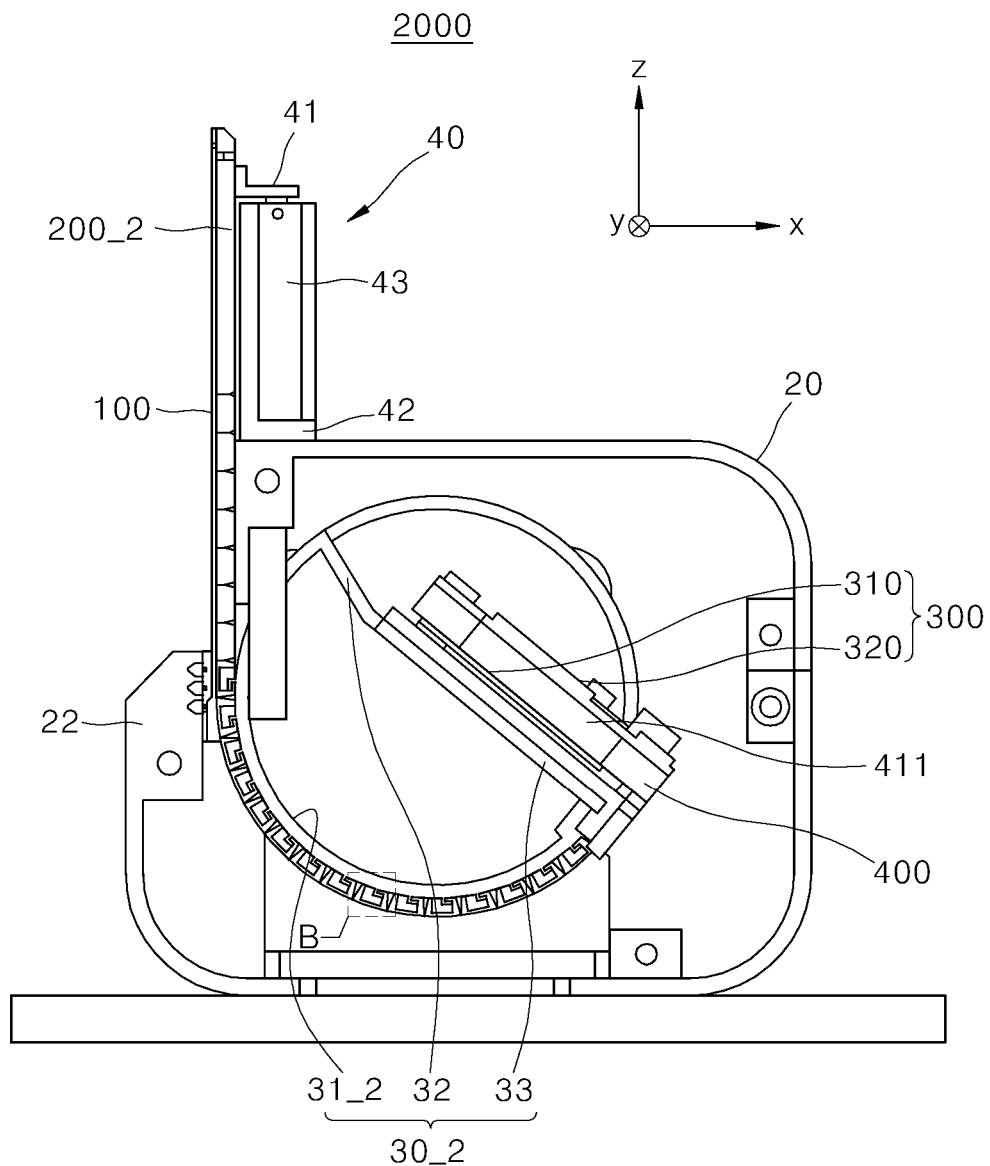
FIG. 9 is a side cross-sectional view of a display apparatus according to another embodiment of the present disclosure.

FIG. 9 is a side cross-sectional view of a display apparatus 2000 according to another embodiment of the present disclosure.

Figure 10:
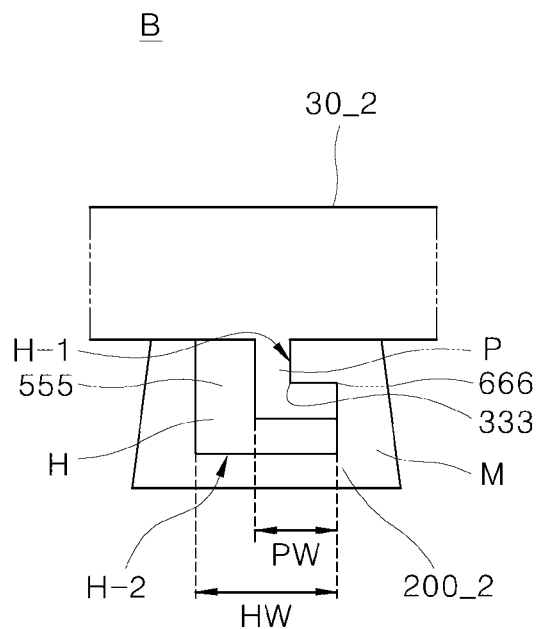
FIG. 10 is an enlarged view of area B of the display apparatus of FIG. 9 according to another embodiment of the present disclosure.

FIG. 10 is an enlarged view of a portion B of FIG. 9 of the display apparatus 2000 according to another embodiment of the present disclosure.

In the display apparatus 2000 in FIG. 9 and FIG. 10, the components except for a first guide member 200_2 and a second guide member 30_2 are substantially the same as those as described above with respect to the display apparatus 1000. Thus, the description thereof may be omitted or simplified.

Referring to FIG. 9 and FIG. 10, the first guide member 200_2 according to an embodiment of the present disclosure may include at least one first member M. For example, the first member M of the first guide member 200_2 may have a trapezoidal cross-section along its outer peripheral surface so that the display unit 100 may be partially folded when the display unit 100 is bent or returned to a flat state. Embodiments of present disclosure are not limited thereto.

According to an embodiment of the present disclosure, the first member M of the first guide member 200_2 of the display apparatus 2000 may have a groove H defined therein. The at least one first member M may be referred to herein as a guide element M and the groove H may be referred to as a slot H in the guide element M. According to the embodiment of the present disclosure, a second guide member 30_2 of the display apparatus 2000 may include at least one protrusion P.

For example, referring to FIG. 7, when the display unit 100 and the first guide member 200 ascend, the curved portion 31 of the second guide member 30 and the rear surface the first guide member 200 may not contact and face each other.

For example, referring to FIG. 8, when the display unit 100 and the first guide member 200 descend and are accommodated inside the housing 20, the curved portion 31 of the second guide member 30 and the rear surface of the first guide member 200 may contact and face each other.

For example, when the display apparatus is mounted on the vehicle, irregular vibration of the vehicle and thus the display apparatus may occur. For example, in the irregular vibration in the x-axis direction in a driving state of the vehicle, a housing guide 22 may hold the display unit 100 and the first guide member 200 such that vibration thereof may not occur.

For example, due to irregular vibration in the z-axis direction during the vehicle is driving, a gap and movement may occur between the first guide member 200 and the second guide member 30, thereby causing the damage to the display unit 100 of the display apparatus and thus causing malfunction or failure of the display apparatus. According to an embodiment of the present disclosure, in order to improve and prevent this situation, one of the first guide member 200_2 and the second guide member 30_2 of the display apparatus may include at least one groove and the other one thereof may include at least one protrusion. For example, the first guide member 200_2 of the display apparatus 2000 may include at least one groove H, while the second guide member 30_2 may include at least one protrusion P. Alternatively, the second guide member 30_2 of the display apparatus 2000 may include at least one groove H, while the first guide member 200_2 may include at least one protrusion P. However, embodiments of present disclosure are not limited thereto.

At least one groove H of the first guide member 200_2 may correspond to at least one protrusion P of the second guide member 30_2. Alternatively, at least one groove H of the second guide member 30_2 may correspond to at least one protrusion P of the first guide member 200_2. For example, even when vibration in the z-axis direction occurs, the protrusion P may be engaged with the groove H such that there is no gap or vibration between the second guide member 30_2 and the first guide member 200_2. Thus, a stable display apparatus may be provided.

For example, at least one groove H of the first guide member 200_2 and at least one protrusion P of the second guide member 30_2 may have shapes that correspond to each other. For example, at least one groove H of the first guide member 200_2 and at least one protrusion P of the second guide member 30_2 may have the same shape. For example, in order that each of the display unit 100 and the first guide member 200_2 descends so that at least a portion thereof is wound around the curved portion of the second guide member, there should preferably be no interference between the groove H and the protrusion P. For example, a size of each of the at least one groove H and a size of each of the at least one protrusion P may be different from each other. For example, the size of each of the at least one groove H may be larger than the size of each of the at least one protrusion P. For example, a width HW of each of the at least one groove H may be greater than a width PW of each of the at least one protrusion P.

According to an embodiment of the present disclosure, the groove H of the first member M of the first guide member 200_2 may include a bent portion 333, a locking portion 666, and an opening 555. The bent portion 333 may be used to fix the second guide member 30_2 and the first guide member 200_2 to each other to prevent the movement due to the vibration in z-axis direction while the vehicle is running, for example. The protrusion P of the second guide member 30_2 may protrude toward the first guide member 200_2.

According to an embodiment of the present disclosure, the opening 555 of the first guide member 200_2 may be a space area between the first guide member 200_2 and the second guide member 30_2. The opening 555 of the first guide member 200_2 may act as a free space to prevent interference between the first guide member 200_3 and the second guide member 30_2 such that the first guide member 200_2 can move (slide, roll up or roll down).

According to an embodiment of the present disclosure, there may be an area in which the first guide member 200_2 and the second guide member 30_2 overlap each other. For example, the bent portion 333 of the groove H of the first guide member 200_2 may overlap with the protrusion P of the second guide member 30_2. This may protect the display unit 100 without being affected by the movement even when the display unit moves. In an embodiment, the opening 555 of the groove H is a slot with a generally L shape including a vertical portion that leads into the opening, and a horizontal portion that extends perpendicular to the vertical portion to define the bent portion 333 and the locking portion 666. The protrusion P may have a shape that corresponds at least to the bent portion 333 and the locking portion 666 (or a "hook" shape that engages part of the "L" shape of the groove H) of the groove H. As noted, the opening 555 is wider both vertically and horizontally than the protrusion P to avoid interference between these components during operation.

Figure 12:
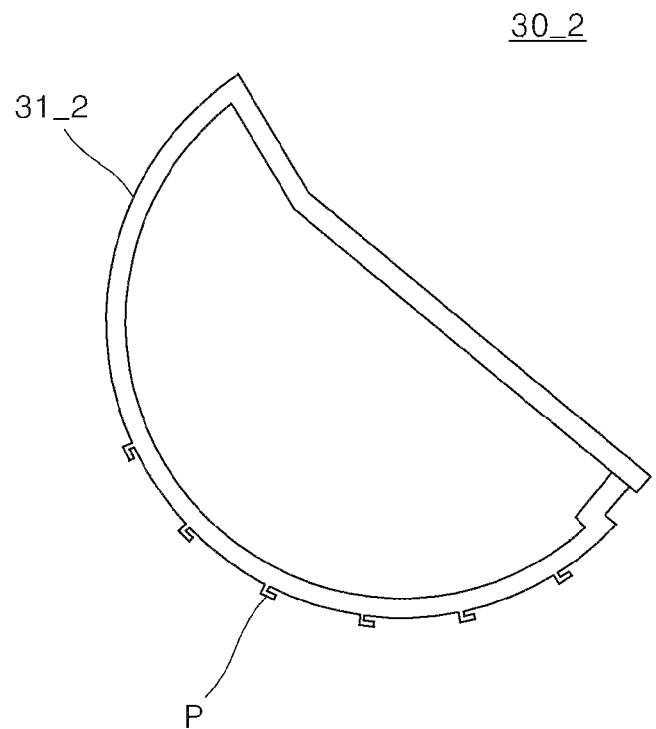
FIG. 12 is a drawing of a second guide member according to another embodiment of the present disclosure.

The number of the first members M including the at least one groove H may vary depending on a size of the display area of the display unit 100 or a product size. Referring to FIG. 9 and FIG. 12, the protrusion P of the second guide member 30_2 may be disposed on the curved portion 31_2 of the second guide member 30_2.

According to an embodiment of the present disclosure, a first surface (or one side) H-1 of the groove H, such as a surface defining the bent portion 333 and the locking portion 666, may be in contact with the protrusion P, while the other second surface (or other side) H-2 of the groove H may not be in contact with the protrusion P and is spaced from the protrusion P. The first surface H-1 thereof serves to fix the first guide member 200_2 and the second guide member 30_2 to each other in a contacting manner with each other, while the second surface H-2 does not contact with the protrusion P such that the display unit 100 and the first guide member 200_2 can move.

According to embodiments of the present disclosure, the groove H and the protrusion P may have various shapes. However, embodiments of the present disclosure are not limited thereto. For example, the groove H may have a shape of an 'L' or an inverted 'L'. However, embodiments of the present disclosure are not limited thereto. For example, the protrusion H may have the shape of an 'L' or an inverted 'L'. The groove H and the protrusion P may have the same shape or may have different shapes. However, embodiments of the present disclosure are not limited thereto.

Figure 11:
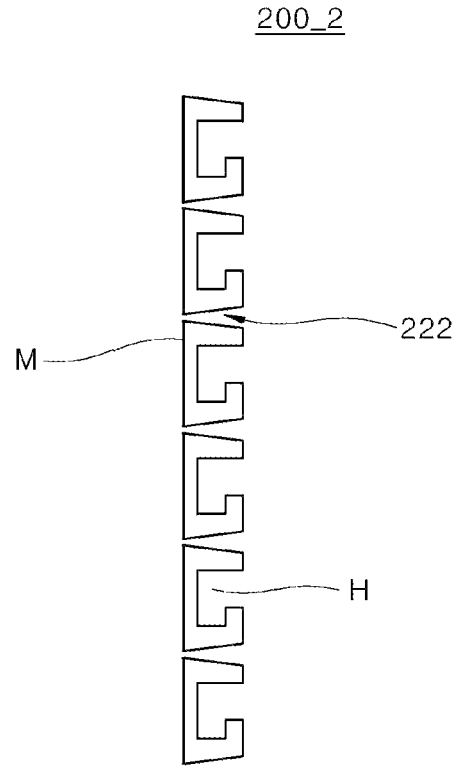
FIG. 11 is a drawing of first members of a first guide member according to another embodiment of the present disclosure.

FIG. 11 is a drawing of the first member M of the first guide member 200_2 of the display apparatus 2000 according to another embodiment of the present disclosure.

FIG. 12 is a drawing of the second guide member 30_2 of the display apparatus 2000 according to another embodiment of the present disclosure.

According to the present disclosure, a space area 222 may be defined between the first members M or guide elements M of the first guide member 200_2 so that the display panel may be partially folded when the display panel is bent or returned to a flat state. At least one groove H and at least one protrusion P may be constructed to correspond to each other. For example, each of the at least one groove H and each of the at least one protrusion P may be constructed to correspond to each other or be engaged with each other. For example, the at least one groove H and the at least one protrusion P may be engaged with each other in a one-to-one correspondence. For example, the number of the at least one groove H of the first guide member 200_2 may be equal to the number of the at least one protrusion P of the second guide member 30_2. The number of grooves H and the number of protrusions P may be different from each other. However, embodiments of the present disclosure are not limited thereto. In an embodiment, the first members M and protrusions P operate similarly to a curved rack and pinion gear combination. The protrusions P (pinion) on the curved portion 31_2 engage the grooves H or slots H in the guide elements M to engage the guide elements M and roll or bend the first guide member 200_2 and the display unit around the curved portion 31_2.

Figure 13:
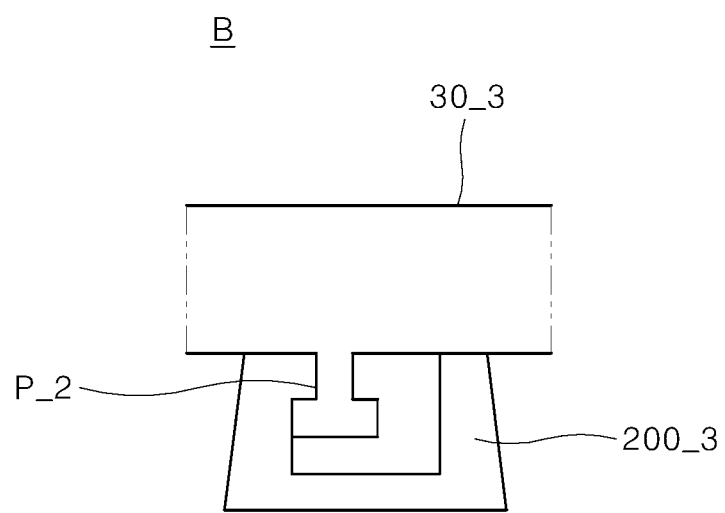
FIG. 13 is an enlarged view of area B of the display apparatus of FIG. 9 according to another embodiment of the present disclosure.

FIG. 13 is an enlarged view of a portion B of FIG. 9 of a display apparatus according to another embodiment of the present disclosure.

In the display apparatus according to another embodiment of the present disclosure in FIG. 13, the components except for a first guide member 200_3 and a second guide member 30_3 are substantially the same as those as described above. Thus, the description thereof may be omitted or simplified.

Referring to FIG. 13, according to an embodiment of the present disclosure, at least one groove H of the first guide member and the protrusion P of the second guide member may have various shapes. For example, a protrusion P_2 of the second guide member 30_3 may have a 'T' shape. However, embodiments of the present disclosure are not limited thereto. A location of the bent portion of the groove of the first guide member 200_3 may be different from that in the above-described embodiment. However, the present disclosure is not limited thereto.

Figure 14:
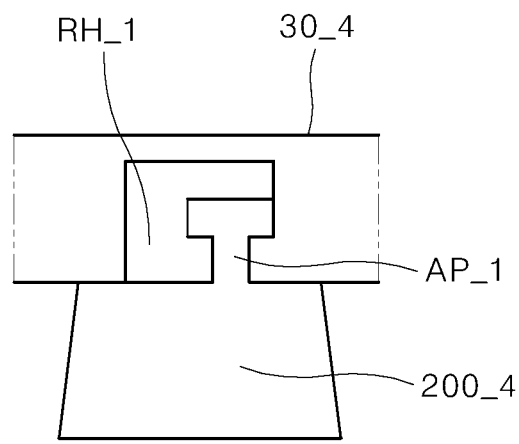
FIG. 14 and FIG. 15 are enlarged views of area C of the display apparatus of FIG. 8 according to another embodiment of the present disclosure.
Figure 15:
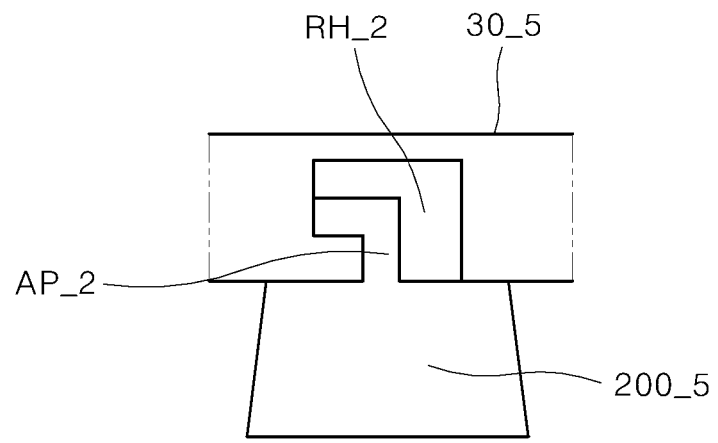

FIG. 14 and FIG. 15 are enlarged views of a portion C of FIG. 8 of the display apparatus according to another embodiment of the present disclosure.

In the display apparatus according to another embodiment of the present disclosure in FIG. 14 and FIG. 15, the components except for the first guide member and a second guide member are substantially the same as those as described above Thus, the description thereof may be omitted or simplified.

Referring to FIG. 14 and FIG. 15, contrary to the embodiments as described above, the second guide member may have at least one groove and the first guide member may have at least one protrusion. The shapes of the grooves and the protrusions may be various. However, embodiments of the present disclosure are not limited thereto.

Referring to FIG. 14, a second guide member 30_4 according to an embodiment of the present disclosure may have at least one groove RH_1 defined therein, while a first guide member 200_4 may have at least one protrusion AP_1. The protrusion AP_1 of the first guide member 200_4 may have a 'T' shape.

Referring to FIG. 15, a second guide member 30_5 according to an embodiment of the present disclosure may have a groove RH_2 defined therein, while the first guide member 200_5 may have a protrusion AP_2. The protrusion AP_2 of the first guide member 200_5 may have an 'L' shape or an inverted 'L' shape.

Figure 16:
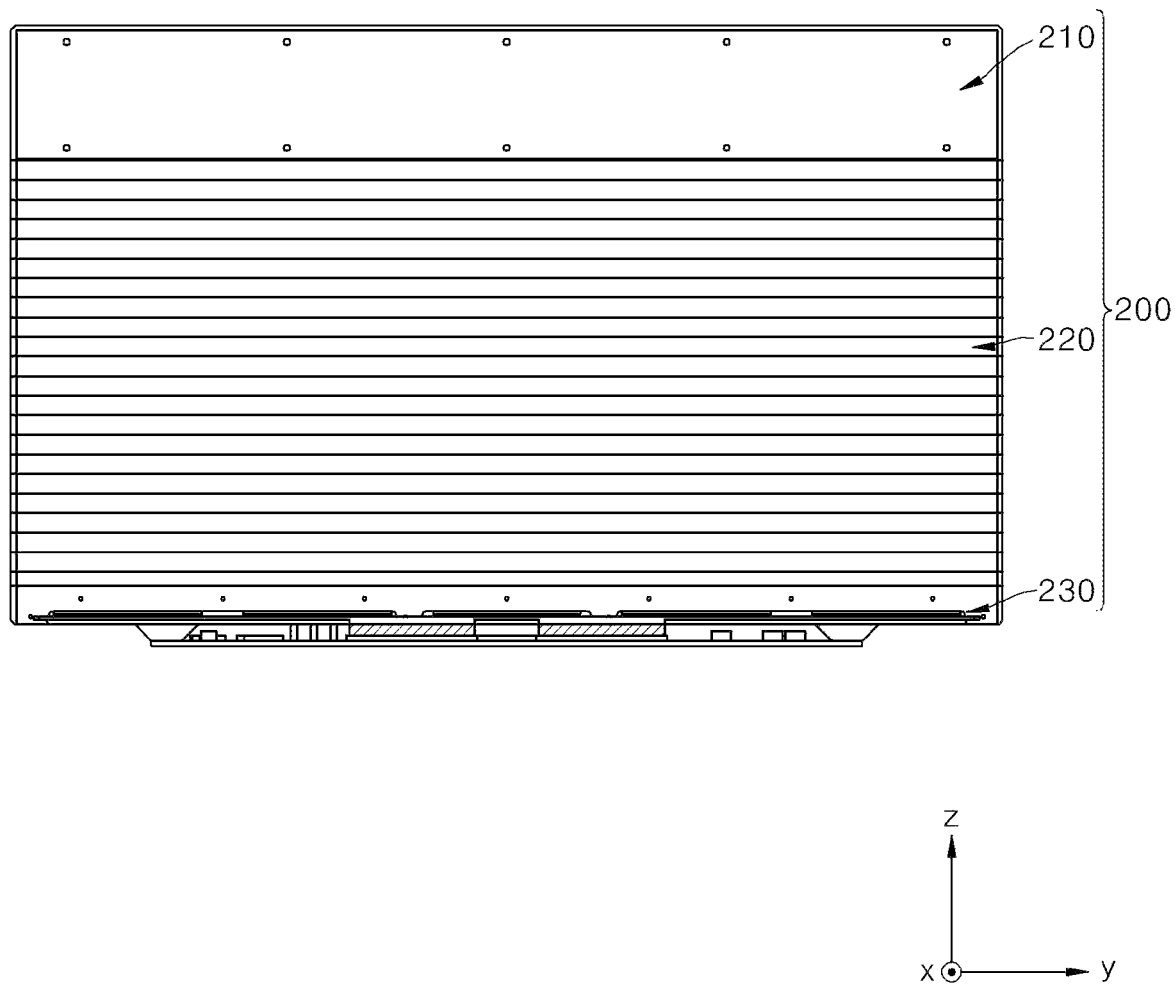
FIG. 16 is a rear view showing a display apparatus according to an embodiment of the present disclosure.

FIG. 16 is a rear view showing a display apparatus according to an embodiment of the present disclosure.

The first guide member 200 may have a structure in which at least a portion thereof is deformable so that the at least a portion may move integrally with the display panel 1. Each of the display panel 1 and the first guide member 200 may be configured so that at least a portion thereof slides in the first direction. For example, each of the display panel 1 and the first guide member 200 may be configured so that at least a portion thereof moves up and down with respect to the display apparatus 1000 or 2000.

For example, in order to deal with the deformation, the first guide member 200 may include a first area 210, a second area 220, and a third area 230. However, embodiments of the present disclosure are not limited thereto, the first guide member 200 may include more than three areas.

The first guide member 200 may have a bent area and a non-bent area distinguished from each other.

Referring to FIG. 16, according to an embodiment of the present disclosure, the first area 210 and the third area 230 may be upper and lower areas, respectively, and the second area 220 may be disposed between the first area 210 and the third area 230. However, embodiments of the present disclosure are not limited thereto.

For example, the first area 210 may be attached to a portion of the display panel 1. For example, the first area 210 may be attached to an upper side of the display panel 1 to support and protect an upper portion of the display panel 1 when the roll-up display apparatus 1000 or the display module 10 stands upright. The first area 210 of the first guide member 200 may be flat and may not include openings or other structures described herein with respect to rolling or bending. The first area 210 may be an area corresponding to an area where the display unit 100 is always exposed to the outside of the housing 20.

For example, the second area 220 may be positioned under the first area 210, and may be a deformable (i.e., bendable or rollable) area.

For example, the second area 220 may be attached to a middle area of the display panel 1 and may support the display panel 1 even when sliding in the first direction (i.e., the Z direction) so as to be bent or be returned to a flat state. To this end, the plurality of first members M may be connected to each other to form the second area 220. In the second area 220, the space area 222 may be defined between adjacent ones of the first members M, as shown in FIG. 11, so that the display panel 1 may be partially folded when the display panel 1 is bent or returned to a flat state.

For example, the third area 230 may be positioned under the second area 220, and may be a deformable (bendable or variable) area. However, the present disclosure is not limited thereto.

The third area 230 may be attached to a portion of the display panel 1. For example, the third area 230 may be attached to a lower side of the display panel 1 and support the lower portion of the display panel 1 and the bracket 400.

According to the embodiment of the present disclosure, the display panel of the display apparatus 1000 or 2000 may be rolled (bent or slide) in an area corresponding to at least the second area 220, which is preferably at least a majority of the display panel 1 in some embodiments. According to an embodiment of the present disclosure, the first area 210 may be an area corresponding to an area in which the display panel of the display apparatus 1000 is not rollable.

Figure 17:
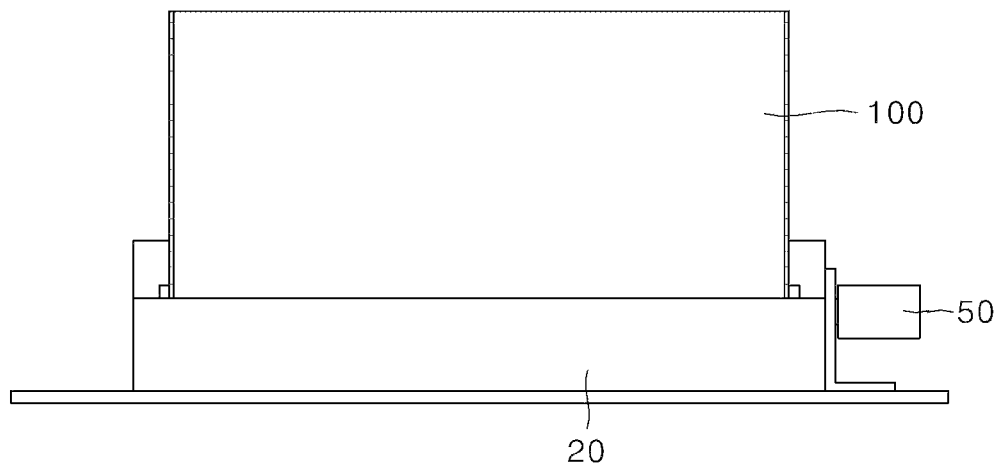
FIG. 17 and FIG. 18 are front views of a display apparatus according to an embodiment of the present disclosure.
Figure 18:
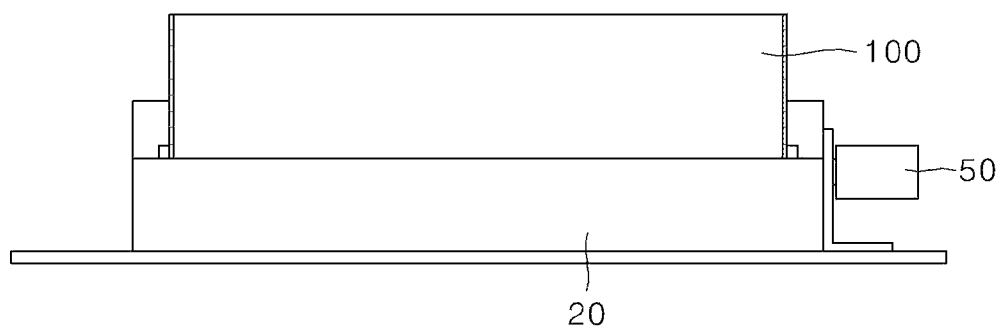

FIG. 17 and FIG. 18 are front views of a display apparatus according to an embodiment of the present disclosure in which the display is raised or rolled up and lowered or rolled down, respectively.

Figure 19:
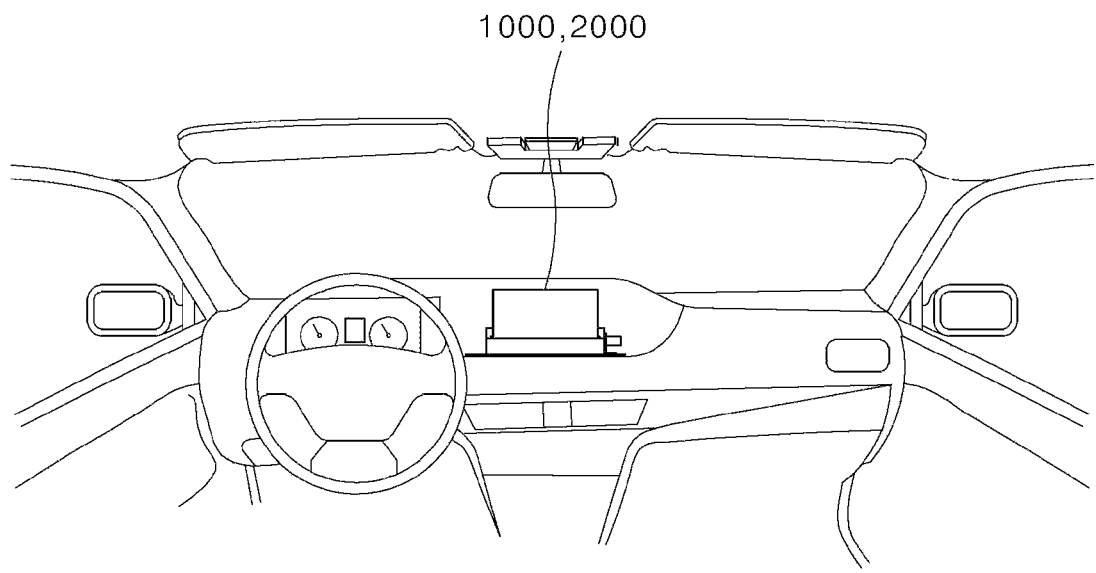
FIG. 19 is a front view of a display apparatus according to an embodiment of the present disclosure in a raised or rolled up configuration and mounted in a vehicle.
Figure 20:
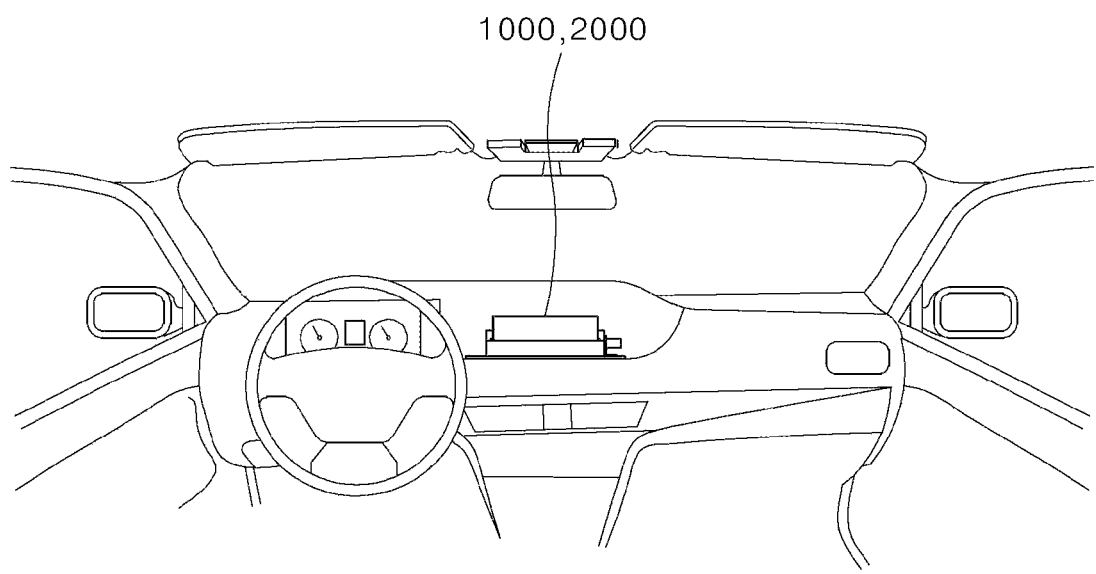
FIG. 20 is a front view of a display apparatus according to an embodiment of the present disclosure in a lowered or rolled down configuration and mounted in a vehicle.

FIG. 19 and FIG. 20 are drawings showing a state in which the display apparatus according to an embodiment of the present disclosure is installed in a vehicle and is raised up or rolled up and lowered or rolled down, respectively.

For example, the display apparatus 1000 or 2000 may be disposed in a top surface of a center of a center fascia of a vehicle. As shown in FIG. 18 and FIG. 20, when the vehicle is stopped or parked, the display unit 100 of the display apparatus may be bent or rolled and stored in the housing 20. As shown in FIG. 17 and FIG. 19, when the driver starts or drives the vehicle, the display unit 100 may be unrolled and protrude out of the housing 20. The application of the display apparatus of the present disclosure to the vehicle is an example of use. However, embodiments of the present disclosure are not limited thereto.

Figure 21:
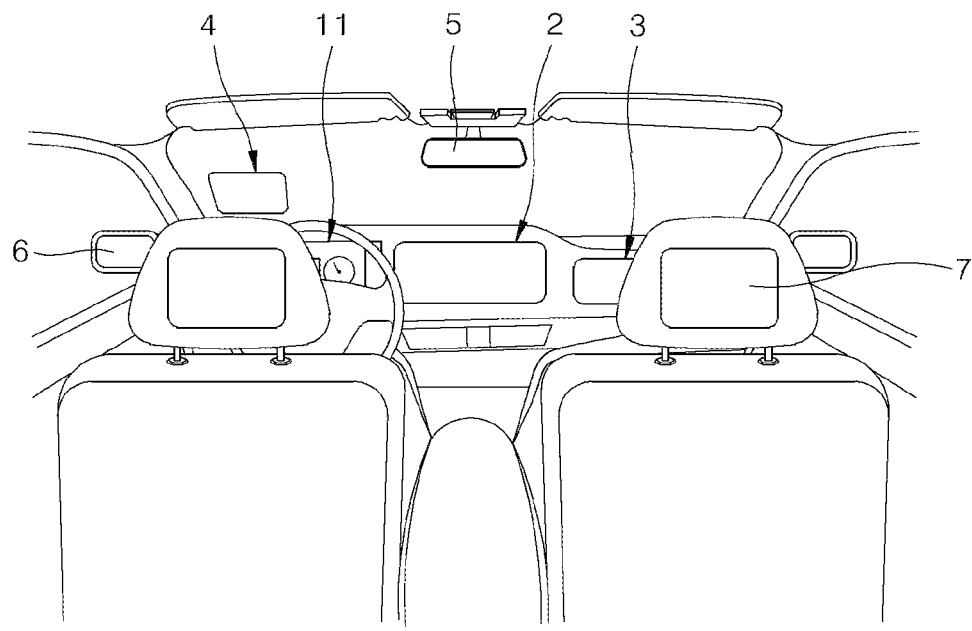
FIG. 21 is a diagram illustrating a display apparatus according to an embodiment of the present disclosure disposed in a dashboard of a vehicle.

FIG. 21 is a diagram showing an example of use of a display apparatus according to an embodiment of the present disclosure.

As shown in FIG. 21, the display apparatus according to an embodiment of the present disclosure may be disposed in the dashboard of the vehicle. The dashboard of the vehicle may include a component disposed in front of front seats (e.g., driver's seat, passenger seat) of the vehicle. Furthermore, the dashboard of the vehicle may be equipped with an input component for operating various functions of the vehicle.

As shown in FIG. 21, the display apparatus according to an embodiment of the present disclosure may include a first display apparatus 11 including an instrument panel indicating a speed, a fuel level, a temperature in the vehicle, an air conditioner, etc., a second display apparatus 2 including an audio system that displays video including a sound volume and a list of sound sources played from a storage medium, and a frequency of the radio, and a third display apparatus 3 that displays the status of various systems inside the vehicle. In addition, the display apparatus may further include a navigation system that provides directions and traffic information to the user. The display apparatus according to an embodiment of the present disclosure may provide various information related to the vehicle such as vehicle driving information (e.g., current vehicle speed, a remaining fuel amount, a driving distance), and information about vehicle parts (e.g., damage to a vehicle tire).

According to one embodiment of the present disclosure, as shown in FIG. 21, the display apparatus may extend horizontally so as to face both the driver's seat and the passenger seat, and may provide an image or video to both the driver and the passenger in the passenger seat of the vehicle, and may display an image based on the user's manipulation.

The installation area of the display apparatus according to an embodiment of the present disclosure is not limited to the area of the vehicle's dashboard.

As shown in FIG. 21, the display apparatus according to an embodiment of the present disclosure may include a fourth display apparatus 4 that provides vehicle driving-related information on a windshield of the vehicle facing the driver.

As shown in FIG. 21, the display apparatus according to an embodiment of the present disclosure may further include at least one of a fifth display apparatus 5 disposed in a rear mirror that displays a situation in rear of the vehicle, a sixth display apparatus 6 disposed in a side mirror that displays a side view around the vehicle, and a seventh display apparatus 7 that displays an image or video to passengers on a rear seat of the vehicle.

Figure 22:
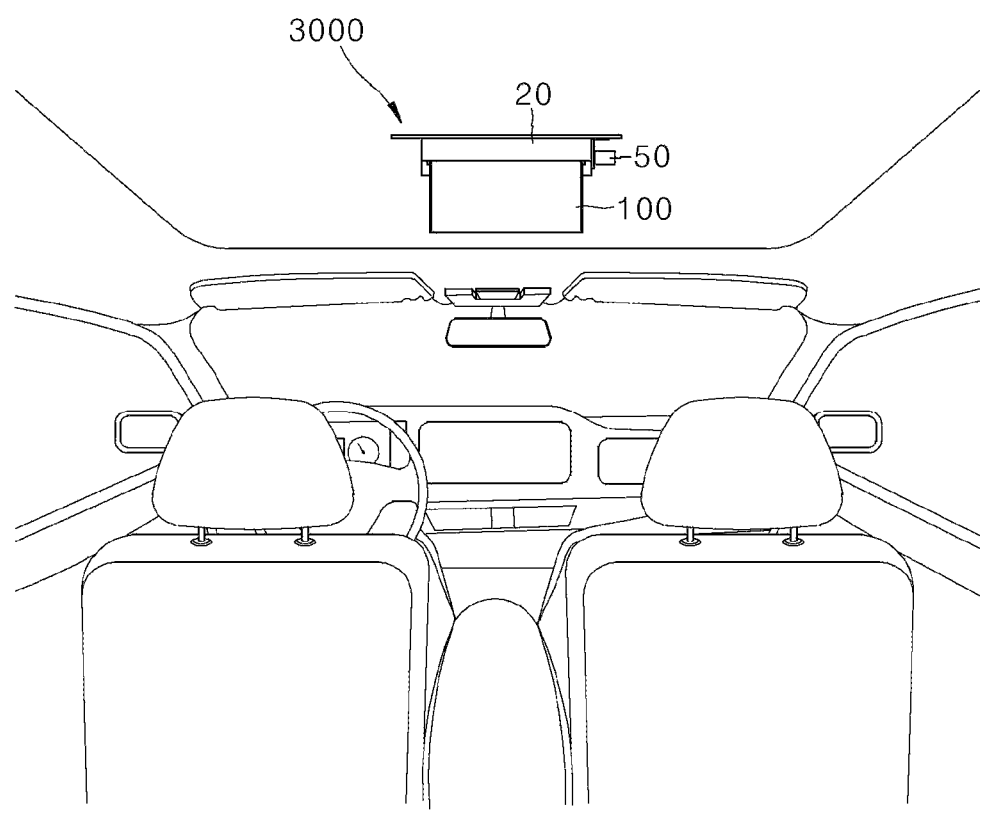
FIG. 22 is a diagram illustrating a display apparatus according to an embodiment of the present disclosure disposed on a ceiling (roof) of a vehicle or other transportation device.

Each of the fifth display apparatus 5 and the sixth display apparatus 6 may provide information on a structure approaching the vehicle, a separation distance from the structure, and a speed of other vehicles. Each of the fifth display apparatus 5 and the sixth display apparatus 6 may be disposed in a limited area of the mirror so as not to disturb the function of the mirror. The display apparatus of embodiments of the present disclosure may be applied to various areas as well as the dashboard of the vehicle. Furthermore, the display apparatus of the present disclosure is not limited thereto and, may be mounted on vehicles, ships, aircraft, or transportation means, and may also be applied to devices carried and used by users. embodiments of the present disclosure are not limited thereto. FIG. 22 is a diagram showing an example of use of a display apparatus according to an embodiment of the present disclosure.

Referring to FIG. 22, for example, a display apparatus 3000 according to an embodiment of the present disclosure may be disposed on a ceiling (roof) of the transportation means such as the vehicle. Contrary to the above-described example, when the display apparatus 3000 is disposed on the ceiling, each of the display unit 100 and the first guide member descends from the housing 20 disposed at a top, such that the display area thereof may be increased. A direction in which the display unit 100 and/or the first guide member is bent is not limited thereto.

Aspects and embodiments of the display apparatus of the present disclosure may be described as follows.

One aspect of the present disclosure provides a display apparatus including: a display unit having at least a portion being deformable; a display panel included in the display unit; a first guide member disposed on a rear surface of the display unit, and having at least a portion being deformable; a printed circuit board electrically connected to the display panel; and a second guide member configured so that at least a portion of each of the display unit and the first guide member is wound around the second guide member, wherein one of the first guide member and the second guide member has at least one groove defined therein, while the other of the first guide member and the second guide member has at least one protrusion.

According to some embodiments of the display apparatus, the first guide member includes a plurality of first members, wherein a space area is defined between adjacent ones of the plurality of first members.

According to some embodiments of the display apparatus, each of the plurality of first members may have a trapezoidal cross-section along its outer peripheral surface.

According to some embodiments of the display apparatus, the groove may be defined in the first member.

According to some embodiments of the display apparatus, the groove in the first member may correspond to the protrusion in the second guide member.

According to some embodiments of the display apparatus, the groove may include a bent portion, a locking portion, and an opening.

According to some embodiments of the display apparatus, the bent portion of the groove may overlap with the protrusion in the second guide member, and the bent portion of the groove may have the same shape as the protrusion in the second guide member.

According to some embodiments of the display apparatus, the protrusion may have a 'T' shape or a 'L' shape.

According to some embodiments of the display apparatus, the first guide member includes a first area and a second area, wherein the first area is flat, wherein the second area has the groove defined therein.

According to some embodiments of the display apparatus, the first area is positioned on top of the second area, wherein the first area and the second area are connected to each other.

According to some embodiments of the display apparatus, the first guide member has the at least one groove defined therein, wherein the second guide member has the at least one protrusion.

According to some embodiments of the display apparatus, a size of each of the at least one groove is different from a size of each of the at least one protrusion.

According to some embodiments of the display apparatus, the size of each of the at least one groove is larger than the size of each of the at least one protrusion.

According to some embodiments of the display apparatus, the at least one groove respectively corresponds to the at least one protrusion.

According to some embodiments of the display apparatus, a number of at least one groove is equal to a number of the at least one protrusion.

According to some embodiments of the display apparatus, each of the at least one groove has a bent portion, a locking portion, and an opening, According to some embodiments of the display apparatus, a shape of each of the at least one groove corresponds to a shape of each of the at least one protrusion.

According to some embodiments of the display apparatus, each of the at least one groove has an 'L' shape.

According to some embodiments of the display apparatus, each of the at least one protrusion has a 'T' shape.

According to some embodiments of the display apparatus, the first guide member has the at least one protrusion, wherein the second guide member has the at least one groove defined therein.

According to some embodiments of the display apparatus, a size of each of the at least one groove is larger than a size of each of the at least one protrusion.

According to some embodiments of the display apparatus, the at least one groove respectively corresponds to the at least one protrusion.

According to some embodiments of the display apparatus, the display apparatus further comprises a housing constructed to accommodate therein at least a portion of the display unit.

According to some embodiments of the display apparatus, the display apparatus further comprises a guide unit connected to the housing and the first guide member.

According to some embodiments of the display apparatus, the guide unit includes: a movable portion; and a connection portion connecting the movable portion and the first guide member to each other.

According to some embodiments of the display apparatus, a cross-section of the second guide member has a semicircular shape.

According to some embodiments of the display apparatus, the display unit may be implemented so as to be applied to a slidable display unit or a display unit for a vehicle.

Another aspect of the present disclosure provides a display apparatus including a display panel having at least a portion being deformable, a cover member disposed on the display panel, a support member disposed on a rear surface of the display panel, a first guide member disposed on the rear surface of the display panel and having at least a portion being deformable, a printed circuit board electrically connected to the display panel, and a second guide member configured so that at least a portion of each of the display panel and the first guide member is wound around the second guide member, wherein the first guide member may include a plurality of first members, and a space area may be defined between adjacent ones of the plurality of first members.

According to some embodiments of the display apparatus, the second guide member includes a curved portion and a connection portion, wherein one of the first guide member and the curved portion of the second guide member may include at least one groove and the other thereof may include at least one protrusion.

According to some embodiments of the display apparatus, the first guide member may include at least one groove, and the curved portion of the second guide member may include at least one protrusion.

According to some embodiments of the display apparatus, the first guide member may include at least one protrusion, and the curved portion of the second guide member may include at least one groove.

According to some embodiments of the display apparatus, one side of the groove may be in contact with the protrusion, and the other side of the groove may not be in contact with the protrusion.

Although the embodiments of the present disclosure have been described in more detail with reference to the accompanying drawings, the present disclosure is not necessarily limited to these embodiments, and may be modified in a various manner within the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:
a display assembly having a deformable portion;
a first guide member disposed on a rear surface of the display assembly, the first guide member having a deformable portion;
a printed circuit board electrically connected to the display panel; and
a second guide member coupled to the display assembly and the first guide member, wherein at least a portion of each of the display assembly and the first guide member are configured to be wound around the second guide member,
wherein at least one of the first guide member and the second guide member includes a groove and the other of the first guide member and the second guide member includes a protrusion,
wherein the groove includes a bent portion, a locking portion, and an opening, and
wherein the bent portion of the groove overlaps with the protrusion, and the bent portion of the groove has the same shape as the protrusion in the second guide member.

2. The display apparatus of claim 1, wherein the first guide member includes a plurality of guide elements and a space between adjacent ones of the plurality of guide elements.

3. The display apparatus of claim 2, wherein each of the plurality of guide elements has a trapezoidal cross-section along its outer peripheral surface.

4. The display apparatus of claim 2, wherein the first guide member includes the groove and the second guide member includes the protrusion.

5. The display apparatus of claim 4, wherein the groove is configured to receive and engage the protrusion of the second guide member.

6. The display apparatus of claim 1, wherein the protrusion has a 'T' shape or a 'L' shape.

7. The display apparatus of claim 1, wherein the first guide member includes a first area and a second area,
wherein the first area is flat, and
wherein the groove is in the second area of the first guide member.

8. The display apparatus of claim 7, wherein the first area is positioned on top of the second area,
wherein the first area and the second area are connected to each other.

9. The display apparatus of claim 1, wherein the groove is in the first guide member, and
wherein the second guide member has the protrusion.

10. The display apparatus of claim 9, wherein a size of each of the groove is different from a size of the protrusion.

11. The display apparatus of claim 9, wherein the size of the groove is larger than the size of the protrusion.

12. The display apparatus of claim 9, wherein the groove mates with the protrusion.

13. The display apparatus of claim 1, wherein the groove is one of a plurality of grooves and the protrusion is one of a plurality of protrusions that is equal to the number grooves.

14. The display apparatus of claim 13, wherein each of the grooves includes a bent portion, a locking portion, and an opening.

15. The display apparatus of claim 13, wherein a shape of each of the grooves corresponds to a shape of each of the protrusions.

16. The display apparatus of claim 13, wherein each of the grooves has an 'L' shape.

17. The display apparatus of claim 13, wherein each of the protrusions has a 'T' shape.

18. The display apparatus of claim 1, wherein the first guide member has the protrusion, and
wherein the groove is in the second guide member.

19. The display apparatus of claim 18, wherein a size of the groove is larger than a size of the protrusion.

20. The display apparatus of claim 18, wherein the groove receives the protrusion.

21. The display apparatus of claim 1, wherein the display apparatus further comprises a housing configured to accommodate at least a portion of the display assembly.

22. The display apparatus of claim 21, wherein the display apparatus further comprises a guide assembly connected to the housing and the first guide member.

23. The display apparatus of claim 22, wherein the guide assembly includes:
- a movable portion; and
- a connection portion coupled to the movable portion and to the first guide member.

24. The display apparatus of claim 1, wherein a cross section of the second guide member has a semicircular shape.

25. A display apparatus, comprising:
- a display assembly configured to display an image;
- a first guide member disposed on the display assembly, the first guide member including a groove; and
- a second guide member coupled to the display assembly and to the first guide member,
- the second guide member including a curved portion and a protrusion on the curved portion,
- wherein at least a portion of the display assembly and at least a portion of the first guide member are configured to be wound around the curved portion of the second guide member, and
- wherein the protrusion on the curved portion of the second guide member is configured to mate with the groove of the first guide member,
- wherein the groove of the first guide member includes a bent portion, a locking portion, and an opening, and
- wherein the bent portion of the groove overlaps with the protrusion of the second guide member, and the bent portion of the groove has the same shape as the protrusion in the second guide member.

26. The display apparatus of claim 25, wherein the groove and the protrusion are an "L" shape configured to interdigitate with each other.

* * * * *